(12) United States Patent
Nakashima et al.

(10) Patent No.: US 10,727,729 B2
(45) Date of Patent: Jul. 28, 2020

(54) POWER CONVERTER

(71) Applicant: MITSUBISHI ELECTRIC CORPORATION, Chiyoda-ku, Tokyo (JP)

(72) Inventors: Yukio Nakashima, Tokyo (JP); Takayoshi Miki, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days.

(21) Appl. No.: 15/745,265

(22) PCT Filed: Sep. 3, 2015

(86) PCT No.: PCT/JP2015/075070
§ 371 (c)(1),
(2) Date: Jan. 16, 2018

(87) PCT Pub. No.: WO2017/037916
PCT Pub. Date: Mar. 9, 2017

(65) Prior Publication Data
US 2019/0006934 A1  Jan. 3, 2019

(51) Int. Cl.
*H02M 1/00* (2006.01)
*H02M 1/08* (2006.01)
(Continued)

(52) U.S. Cl.
CPC .............. *H02M 1/08* (2013.01); *H02M 1/44* (2013.01); *H02M 7/487* (2013.01);
(Continued)

(58) Field of Classification Search
CPC .......... H02M 2001/0054; H02M 1/08; H02M 7/5387
See application file for complete search history.

(56) References Cited

U.S. PATENT DOCUMENTS

| 2003/0156439 A1 | 8/2003 | Ohmichi et al. |
| 2005/0128671 A1 | 6/2005 | Miyamoto |
(Continued)

FOREIGN PATENT DOCUMENTS

| EP | 3 089 346 A1 | 11/2016 |
| JP | 06-291631 A | 10/1994 |
(Continued)

OTHER PUBLICATIONS

International Search Report (PCT/ISA/210) dated Nov. 24, 2015, by the Japanese Patent Office as the International Searching Authority for International Application No. PCT/JP2015/075070.
(Continued)

*Primary Examiner* — Adolf D Berhane
*Assistant Examiner* — Afework S Demisse
(74) *Attorney, Agent, or Firm* — Buchanan Ingersoll & Rooney PC

(57) ABSTRACT

A power converter includes: a power converter main circuit that includes semiconductor switching elements; gate drive circuits driving the semiconductor switching elements, respectively; and one or a plurality of impedance element groups connected between at least one pair of the gate drive circuits. At least one of the gate drive circuits includes a detector that detects a voltage across the impedance element group, and changes the driving speed of the semiconductor switching elements in accordance with an output of the detector.

10 Claims, 17 Drawing Sheets

(51) Int. Cl.

| | |
|---|---|
| *H02M 7/5387* | (2007.01) |
| *H02M 7/487* | (2007.01) |
| *H03K 17/0812* | (2006.01) |
| *H02M 1/44* | (2007.01) |
| *H03K 17/795* | (2006.01) |
| *H03K 17/16* | (2006.01) |

(52) U.S. Cl.
CPC .... *H02M 7/5387* (2013.01); *H03K 17/08122* (2013.01); *H03K 17/162* (2013.01); *H03K 17/166* (2013.01); *H03K 17/7955* (2013.01); *H02M 2001/0054* (2013.01); *H03K 2217/0027* (2013.01); *H03K 2217/0081* (2013.01)

(56) References Cited

U.S. PATENT DOCUMENTS

| | | | |
|---|---|---|---|
| 2005/0146295 | A1 | 7/2005 | Miyamoto et al. |
| 2015/0145586 | A1* | 5/2015 | Cho ........................ H03K 17/16 327/379 |
| 2016/0006368 | A1 | 1/2016 | Kusuno et al. |
| 2016/0112043 | A1* | 4/2016 | Hayashiguchi .. H03K 17/08122 |
| 2016/0352321 | A1* | 12/2016 | Yamaguchi .......... H03K 17/162 |

FOREIGN PATENT DOCUMENTS

| | | |
|---|---|---|
| JP | 09-023664 A | 1/1997 |
| JP | 2003-079129 A | 3/2003 |
| JP | 2003-244966 A | 8/2003 |
| JP | 2005-175741 A | 6/2005 |
| JP | 2005-198406 A | 7/2005 |
| JP | 2008-154420 A | 7/2008 |
| JP | 2015/023642 A | 2/2015 |
| JP | 2015-23776 A | 2/2015 |
| WO | WO 2014/128842 A1 | 8/2014 |
| WO | WO 2014/128842 A2 | 8/2014 |
| WO | 2015/097836 A1 | 7/2015 |

OTHER PUBLICATIONS

Written Opinion (PCT/ISA/237) dated Nov. 24, 2015, by the Japanese Patent Office as the International Searching Authority for International Application No. PCT/JP2015/075070.

Notification of Reason for Refusal for Japanese Patent Application No. 2017-534767 dated Aug. 25, 2017.

Office Action dated Oct. 9, 2019, by the Chinese Patent Office in corresponding Chinese Patent Application No. 201580082652.7 and English translation of the Office Action. (9 pages).

Office Action dated Oct. 17, 2019, by the India Patent Office in corresponding India Patent Application No. 201847005535 and English translation of the Office Action. (5 pages).

* cited by examiner

FIG.3
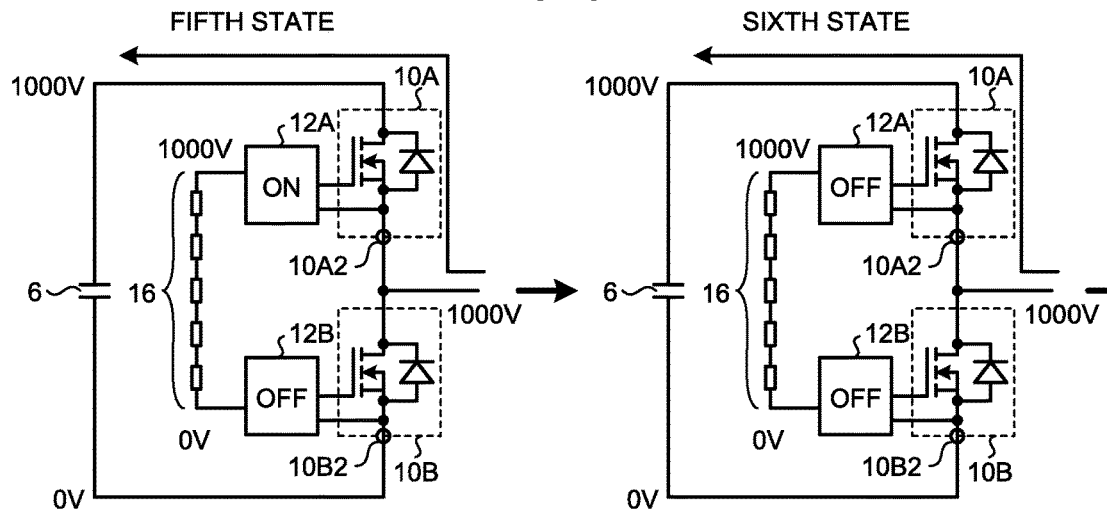
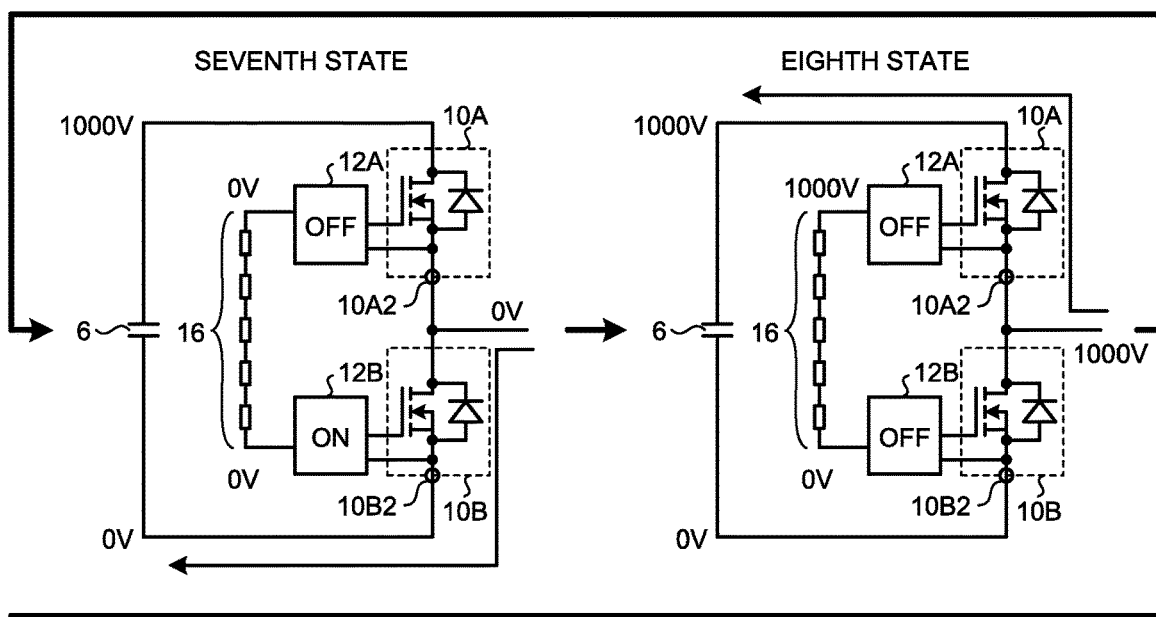
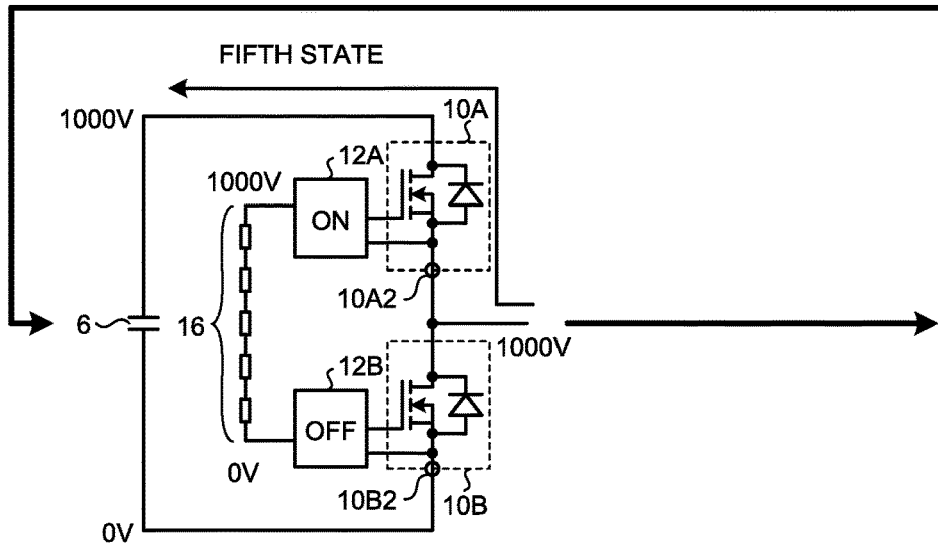

POWER CONVERTER

FIELD

The present invention relates to a power converter that incorporates therein a power semiconductor switching element.

BACKGROUND

A power converter such as an inverter, a servo amplifier, or a switching power supply incorporates therein one or a plurality of power semiconductor switching elements. The power semiconductor switching element undergoes a change in the conduction state between a first main terminal and a second main terminal in accordance with an electrical signal applied between a first signal input terminal and a second signal input terminal. A gate drive circuit receives a command signal from an upper controller to apply an electrical signal between the first signal input terminal and the second signal input terminal of the power semiconductor switching element and drive the power semiconductor switching element.

When the power semiconductor switching element is off, a current does not flow between the first main terminal and the second main terminal even with a high voltage applied therebetween. However, an excessively high voltage applied to the power semiconductor switching element causes a failure of the power semiconductor switching element. A technique has thus been proposed in which a voltage of each part of the power converter is detected and transmitted to the gate drive circuit. The gate drive circuit performs an operation that changes a method of driving the power semiconductor switching element on the basis of information on the transmitted voltage.

With the background art described above, Patent Literature 1 below presents a motor drive system for an electric vehicle. A voltage detection circuit is attached to a DC power supply in the motor drive system to detect a voltage. The voltage detection circuit transmits a signal to the gate drive circuit when the voltage of the DC power supply is higher than or equal to a predetermined voltage. Upon receiving the signal, the gate drive circuit changes the connection configuration of a gate resistor and changes the method of driving the power semiconductor switching element. The gate drive circuit prevents excessive generation of a surge voltage when the power semiconductor switching element is turned on and turned off. This prevents the application of an excessively high voltage to the power semiconductor switching element.

In Patent Literature 2 listed below, a first main terminal of a power semiconductor switching element and a gate drive circuit are connected by wiring. This wiring allows transmission of the voltage between the first main terminal and a second main terminal of the power semiconductor switching element to the gate drive circuit. The gate drive circuit detects the voltage between the first main terminal and the second main terminal of the power semiconductor switching element. The gate drive circuit changes the resistance value of a built-in resistor in accordance with the voltage between the first main terminal and the second main terminal to change the method of driving the power semiconductor switching element and prevent excessive generation of the surge voltage when the power semiconductor switching element is turned on and turned off. This prevents the application of an excessively high voltage to the power semiconductor switching element.

CITATION LIST

Patent Literature

Patent Literature 1: Japanese Patent Application Laid-Open No. H9-23664

Patent Literature 2: Japanese Patent Application Laid-Open No. H6-291631

SUMMARY

Technical Problem

The configurations as disclosed in Patent Literatures 1 and 2 allow the voltage of each part of the power converter to be detected and transmitted to the gate drive circuit. However, a detection target that is the voltage of each part of the power converter is detected at a position away from the position of the gate drive circuit. This causes a problem in that noise is superimposed before voltage information on each part of the power converter reaches the gate drive circuit.

The present invention has been made in view of the aforementioned problem, and an object of the present invention is to obtain a power converter capable of reducing the influence of noise when voltage information on each part of the power converter is transmitted to a gate drive circuit.

Solution to Problem

In order to solve the aforementioned problem and achieve the object, a power converter according to an aspect of the present invention includes a power converter main circuit including two or more semiconductor switching elements; gate drive circuits, each of which drives a corresponding one of the semiconductor switching elements; and one or a plurality of impedance elements connected between at least one pair of the gate drive circuits. At least one of the gate drive circuits includes a detector to detect a voltage across the impedance elements or a current flowing through the impedance elements, and changes a driving speed of the semiconductor switching elements in accordance with an output of the detector.

Advantageous Effects of Invention

The present invention exhibits an effect in that it is possible to reduce the influence of noise when the voltage information on each part of the power converter is transmitted to the gate drive circuit.

BRIEF DESCRIPTION OF DRAWINGS

FIG. 3 is a state transition diagram illustrating a change in an output voltage when the power converter main circuit according to the first embodiment performs a source operation.

DESCRIPTION OF EMBODIMENTS

A power converter according to embodiments of the present invention will now be described with reference to the accompanying drawings. Note that the present invention is not limited by the following embodiments.

First Embodiment

Figure 1:
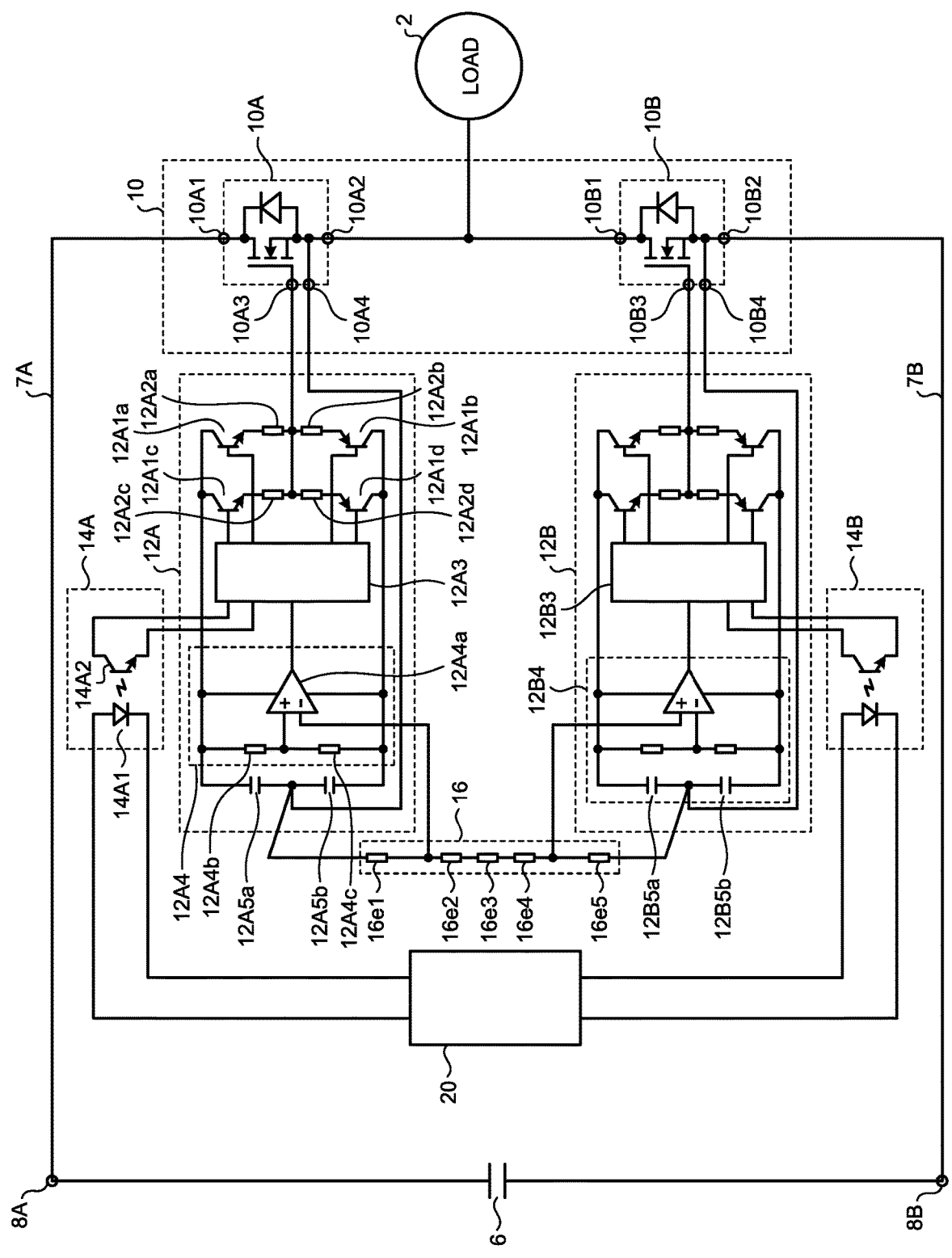
FIG. 1 is a circuit diagram illustrating the configuration of a main part of a power converter according to a first embodiment.

FIG. 1 is a circuit diagram illustrating the configuration of a main part of a power converter according to a first embodiment. As the configuration of the main part of the power converter according to the first embodiment, FIG. 1 illustrates a load 2 to be driven; a power converter main circuit 10 that drives the load 2; gate drive circuits 12A and 12B that are peripheral circuits that control the power converter main circuit 10; insulating circuits 14A and 14B; an impedance element group 16; a switching signal generation unit 20; and a capacitor 6 that is a power supply source for the power converter main circuit 10 and accumulates DC power.

The power converter main circuit 10 of the first embodiment is configured to include a semiconductor switching element 10A as a first power semiconductor switching element connected to a DC bus 7A on a high potential side; and a semiconductor switching element 10B as a second power semiconductor switching element connected to a DC bus 7B on a low potential side. The semiconductor switching element 10A and the semiconductor switching element 10B are connected in series, and the load 2 is connected to the electrical connection point of the elements.

The semiconductor switching element 10A is provided with a first main terminal 10A1, a second main terminal 10A2, a first signal input terminal 10A3, and a second signal input terminal 10A4. Likewise, the semiconductor switching element 10B is provided with a first main terminal 10B1, a second main terminal 10B2, a first signal input terminal 10B3, and a second signal input terminal 10B4. In the power converter main circuit 10 configured as described above, the first main terminal 10A1 of the semiconductor switching element 10A is connected to the DC bus 7A, the second main terminal 10A2 of the semiconductor switching element 10A is connected to the first main terminal 10B1 of the semiconductor switching element 10B, and the second main terminal 10B2 of the semiconductor switching element 10B is connected to the DC bus 7B.

The DC bus 7A is connected to an upper DC terminal 8A of the capacitor 6, and the DC bus 7B is connected to a lower DC terminal 8B of the capacitor 6. That is, the voltage of the capacitor 6 is applied between the DC buses 7A and 7B.

In the power converter main circuit 10 connected as described above, the potential of the DC bus 7A is applied to the load 2 when the semiconductor switching element 10A becomes conductive, and the potential of the DC bus 7B is applied to the load 2 when the semiconductor switching element 10B becomes conductive. The power converter main circuit 10 thus outputs two kinds of potentials, i.e., the potential of the DC bus 7A or the potential of the DC bus 7B, thereby operating as a two-level power converter circuit.

In each of the semiconductor switching elements 10A and 10B, a transistor element and a diode element are connected in parallel. Note that connection of the diode element in each of the switching elements may be omitted depending on the characteristic of the load such as when the load is a resistive load.

Although FIG. 1 illustrates a MOSFET as the transistor element, the transistor element is not limited to the MOSFET but may be any device that can switch a state between a low resistance state and a high resistance state by using an electrical signal. For example, an IGBT or a bipolar transistor may be used as the transistor element. Moreover, a wide band-gap semiconductor such as SiC, GaN, or diamond in addition to Si which is used widely may be used as a material of the transistor element and the diode element that make up each of the semiconductor switching elements 10A and 10B.

The gate drive circuit 12A is a first gate drive circuit that drives the semiconductor switching element 10A that is the first power semiconductor switching element. The gate drive circuit 12B is a second gate drive circuit that drives the semiconductor switching element 10B that is the second power semiconductor switching element. The gate drive circuit 12A has the same configuration as the gate drive circuit 12B; therefore, the internal configuration of the circuits will be described with reference to the gate drive circuit 12A.

The gate drive circuit 12A includes four bridged transistor elements, specifically a first on transistor 12A1*a*, a first off transistor 12A1*b*, a second on transistor 12A1*c*, and a second off transistor 12A1*d*. The first on transistor 12A1*a* and the first off transistor 12A1*b* are connected in series via two gate resistors 12A2*a* and 12A2*b*, and the second on transistor 12A1*c* and the second off transistor 12A1*d* are connected in series via two gate resistors 12A2*c* and 12A2*d*. The connection point of the gate resistors 12A2*a* and 12A2*b* and the connection point of the gate resistors 12A2*c* and 12A2*d* are connected to each other to be connected to the first signal input terminal 10A3 of the semiconductor switching element 10A.

The gate drive circuit 12A further includes a switching speed changing unit 12A3 that changes the speed at the time of driving the semiconductor switching element 10A that is the first power semiconductor switching element. The switching speed changing unit 12A3 can be configured by a logic circuit, for example.

The gate drive circuit 12A further includes a detector 12A4. The detector 12A4 is provided with a comparator 12A4*a* and resistance elements 12A4*b* and 12A4*c* connected in series. Voltage across capacitors 12A5*a* and 12A5*b* connected in series is applied to the comparator 12A4*a* as an operating voltage. A divided voltage of the resistance elements 12A4*b* and 12A4*c* is input to a positive input terminal of the comparator 12A4*a*, and a divided voltage of the impedance element group 16 described later is input to a negative input terminal of the comparator 12A4*a*.

Note that a power supply for applying the operating voltage to the detector 12A4 can also be used as a power supply for driving the gate drive circuit. A dedicated power supply for operating the detector 12A4 need not be provided if the power supply therefor is also used as the power supply for driving the gate drive circuit.

Provided outside the gate drive circuits 12A and 12B are the switching signal generation unit 20 that generates switching signals for driving the corresponding semiconductor switching elements 10A and 10B; the insulating circuits 14A and 14B that receive the switching signals generated by the switching signal generation unit 20 and transmit the signals to the corresponding gate drive circuits 12A and 12B; and the impedance element group 16 that detects the voltage between the second main terminal 10A2 of the semiconductor switching element 10A and the second main terminal 10B2 of the semiconductor switching element 10B.

The insulating circuit 14A is a circuit that electrically insulates the switching signal generation unit 20 from the gate drive circuit 12A. The insulating circuit 14B is a circuit that electrically insulates the switching signal generation unit 20 from the gate drive circuit 12B. A photocoupler can be used as each of the insulating circuits 14A and 14B. As for the insulating circuit 14A, the insulating circuit 14A is composed of a photocoupler including a light-emitting diode 14A1 and a phototransistor 14A2.

The impedance element group 16 is configured to include one or a plurality of impedance elements that are connected between the connection point of the capacitors 12A5*a* and 12A5*b* that are connected in series and serve as a power supply for the operation of the gate drive circuit 12A, and the connection point of capacitors 12B5*a* and 12B5*b* that are connected in series and serve as a power supply for the operation of the gate drive circuit 12B. That is, FIG. 1 illustrates an example in which the impedance element group 16 is disposed between the gate drive circuits 12A and 12B belonging to the same phase. FIG. 1 illustrates five impedance elements 16*e*1, 16*e*2, 16*e*3, 16*e*4, and 16*e*5 that are connected in series.

Note that the impedance element group 16 may be configured by connecting capacitors or diodes in series instead of the impedance elements. The impedance element group 16 is not limited to the series connection of the impedance elements or capacitors, but may be configured by connecting in series parallel circuits of the impedance elements or capacitors. Alternatively, the impedance element group 16 may be configured by a combination of the impedance elements and capacitors. Note that although FIG. 1 illustrates the configuration that detects the voltage across the impedance elements, the current flowing through the impedance elements may be detected instead. For example, a photocoupler may be connected in series with the impedance elements so that the current flowing through the impedance elements is detected by a photodiode provided on a primary side of the photocoupler, and the detected current is transmitted to the gate drive circuit via a phototransistor provided on a secondary side of the photocoupler.

Moreover, although FIG. 1 illustrates an example of detecting the divided voltage generated in the impedance elements that make up the impedance element group 16, the voltage need not be divided if an input breakdown voltage of each of the detectors 12A4 and 12B4 is high. In this case, the voltage across the impedance element group 16 may be applied to the detectors 12A4 and 12B4 without being divided. Moreover, in this case, the impedance element group 16 may be configured to include a plurality of impedance elements connected in series or can be configured to include one impedance element.

Next, as an operation of the main part of the power converter according to the first embodiment, a description will be given of an operation performed when driving the semiconductor switching element 10A making up the first power semiconductor switching element of the power converter main circuit 10.

The switching signal generation unit 20 generates a switching signal for driving the semiconductor switching element 10A and outputs the switching signal to the insulating circuit 14A.

When a command signal for controlling the semiconductor switching element 10A to be turned on (hereinafter referred to as an "on command signal") is input to the insulating circuit 14A as the switching signal from the switching signal generation unit 20, for example, the light-emitting diode 14A1 is illuminated to cause the phototransistor 14A2 to become conductive. When a command signal for controlling the semiconductor switching element 10A to be turned off (hereinafter referred to as an "off command signal") is input to the insulating circuit 14A as the switching signal from the switching signal generation unit 20, for example, the light-emitting diode 14A1 is turned off to cause the phototransistor 14A2 to become non-conductive. Accordingly, the on command signal and the off command signal from the switching signal generation unit 20 are recognized by the switching speed changing unit 12A3 of the gate drive circuit 12A as a change in the current caused by a change in the conduction state of the phototransistor 14A2.

Although the detailed operation of the detector 12A4 will be described later, the detector 12A4 can detect the voltage applied across the semiconductor switching elements 10A and 10B by detecting the voltage between the gate drive circuits 12A and 12B. The detector 12A4 can also detect whether the voltage of the capacitor 6 (hereinafter referred to as a "capacitor voltage") is higher or lower than a reference voltage by detecting the voltage applied across the semiconductor switching elements 10A and 10B. A detection signal by the detector 12A4 is input to the switching speed changing unit 12A3.

The switching speed changing unit 12A3 changes the driving speed of the semiconductor switching elements 10A and 10B on the basis of the detection signal from the detector 12A4 and the command signal from the insulating circuit 14A. Details of the operation in changing the driving speed of the semiconductor switching elements 10A and 10B are as follows.

First, when the speed of turning on the semiconductor switching element 10A is to be increased, the first on transistor 12A1a and the second on transistor 12A1c are both controlled to be turned on while the first off transistor 12A1b and the second off transistor 12A1d are both controlled to be turned off. With both the first on transistor 12A1a and the second on transistor 12A1c being turned on, the gate resistors 12A2a and 12A2c are both connected in parallel to the first signal input terminal 10A3, thereby reducing the gate resistance and increasing the switching speed.

On the other hand, when the speed of turning on the semiconductor switching element 10A is to be reduced, either one of the first on transistor 12A1a and the second on transistor 12A1c is controlled to be turned on while both the first off transistor 12A1b and the second off transistor 12A1d are controlled to be turned off. With only the first on transistor 12A1a being turned on, for example, only the gate resistor 12A2a is connected to the first signal input terminal 10A3, thereby increasing the gate resistance and reducing the switching speed.

When the speed of turning off the semiconductor switching element 10A is to be increased, the first on transistor 12A1a and the second on transistor 12A1c are both controlled to be turned off while the first off transistor 12A1b and the second off transistor 12A1d are both controlled to be turned on. With both the first off transistor 12A1b and the second off transistor 12A1d being turned on, the gate resistors 12A2b and 12A2d are both connected in parallel to the first signal input terminal 10A3, thereby reducing the gate resistance and increasing the switching speed.

When the speed of turning off the semiconductor switching element 10A is to be reduced, the first on transistor 12A1a and the second on transistor 12A1c are both controlled to be turned off while either one of the first off transistor 12A1b and the second off transistor 12A1d is controlled to be turned on. With only the first off transistor 12A1b being turned on, for example, only the gate resistor 12A2b is connected to the first signal input terminal 10A3, thereby increasing the gate resistance and reducing the switching speed.

Note that the present invention is not limited to the aforementioned controls which are described as examples. For example, when the gate resistor 12A2c having a resistance value smaller than the resistance value of the gate resistor 12A2a is used, the first on transistor 12A1a connected to the gate resistor 12A2a with a relatively large resistance value may be controlled to be turned on in order to reduce the speed of turning on the semiconductor switching element 10A, or the second on transistor 12A1c connected to the gate resistor 12A2c with a relatively small resistance value may be controlled to be turned on in order to increase the speed of turning on the semiconductor switching element 10A. For example, when the gate resistor 12A2d having a resistance value smaller than the resistance value of the gate resistor 12A2b is used, the first off transistor 12A1b connected to the gate resistor 12A2b with a relatively large resistance value may be controlled to be turned on in order to reduce the speed of turning off the semiconductor switching element 10A, or the second off transistor 12A1d connected to the gate resistor 12A2d with a relatively small resistance value may be controlled to be turned on in order to increase the speed of turning off the semiconductor switching element 10A.

The description of the operation provided above will be supplemented with an operation in which the impedance element group 16 outputs information corresponding to the capacitor voltage (hereinafter referred to as "capacitor voltage information").

The second main terminal 10A2 and the second signal input terminal 10A4 of the semiconductor switching element 10A have the same potential. The second signal input terminal 10A4 of the semiconductor switching element 10A and one end of the impedance element group 16 are both connected to the connection point of the capacitors 12A5a and 12A5b connected in series, and thus have the same potential. These also apply to the semiconductor switching element 10B. Accordingly, the voltage generated across the impedance element group 16 or the current flowing through the impedance element group 16 represents a potential difference between the second main terminal 10A2 of the semiconductor switching element 10A and the second main terminal 10B2 of the semiconductor switching element 10B. The gate drive circuits 12A and 12B can thus know the potential difference between the second main terminal 10A2 of the semiconductor switching element 10A and the second main terminal 10B2 of the semiconductor switching element 10B by detecting the voltage or the current across the impedance element group 16.

Note that, as one can see from FIG. 1, the impedance element group 16 can be disposed near the gate drive circuits 12A and 12B. This can shorten a path, namely electrical wiring, through which the voltage information or current information from the impedance element group 16 is transmitted to the gate drive circuits 12A and 12B, thereby preventing noise from being superimposed on the electrical wiring. As a result, an effect is obtained where the gate drive circuits 12A and 12B can change or modify the method of driving the semiconductor switching elements 10A and 10B with high accuracy by using accurate voltage information or accurate current information from the impedance element group 16.

Figure 2:
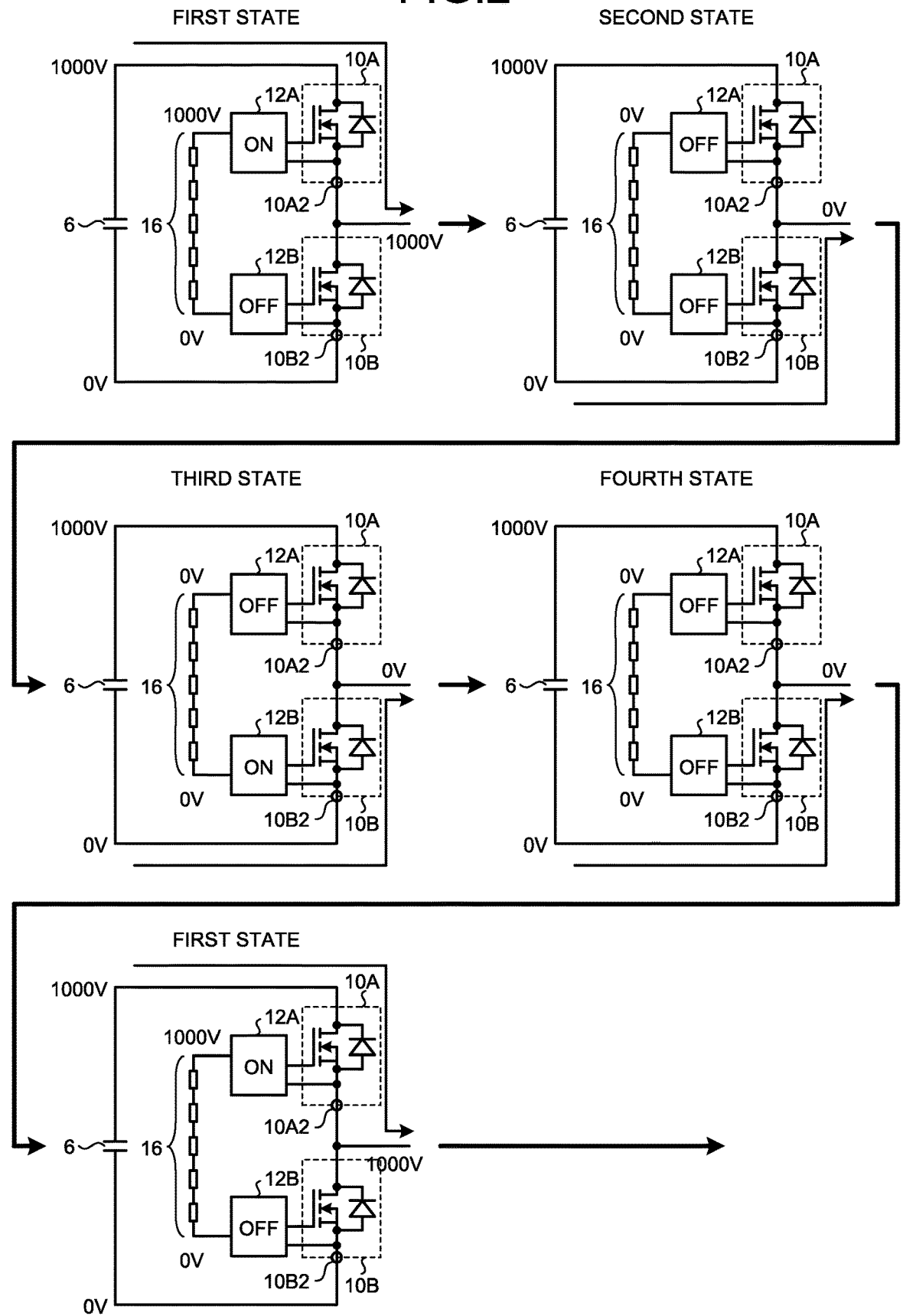
FIG. 2 is a state transition diagram illustrating a change in an output voltage when a power converter main circuit according to the first embodiment performs a sink operation.

Next, the operation of the gate drive circuit will be described in more detail with reference to FIGS. 2 and 3. FIGS. 2 and 3 are state transition diagrams illustrating a change in the output voltage of the power converter main circuit 10 according to the first embodiment, where FIG. 2 is a state transition diagram when the load receives a current, or performs a sink operation, and FIG. 3 is a state transition diagram when the load discharges a current, or performs a source operation. Note that FIGS. 2 and 3 omit display of the load. It is also assumed in the description that the voltage stored in the capacitor 6 is 1000 [V], and a negative terminal of the capacitor 6 is set as the reference potential. That is, the potential at the negative terminal of the capacitor 6 is 0 [V].

First, when the load performs a sink operation, the power converter main circuit 10 repeatedly performs the operation of changing the state from a first state to a second state, from the second state to a third state, from the third state to a fourth state, and then from the fourth state to the first state as illustrated in FIG. 2.

In the first state, the semiconductor switching element 10A is on, and the semiconductor switching element 10B is off. At this point in time, a current flows from a positive terminal of the capacitor 6 to the load through the semiconductor switching element 10A. The potential of the load matches the potential at the positive terminal of the capacitor 6. Thus, the potential at the second main terminal 10A2 of the semiconductor switching element 10A is 1000 [V]. The potential at the second main terminal 10B2 of the semiconductor switching element 10B is 0 [V]. A voltage of 1000 [V] identical to the capacitor voltage is applied to the impedance element group 16.

The power converter main circuit 10 transitions from the first state to the second state when the semiconductor switching element 10A is switched from on to off. This causes the potential of each part to change. The current path from the capacitor 6 to the load changes as well.

In the second state, the semiconductor switching element 10A is off, and the semiconductor switching element 10B is off. At this point in time, a current flows from the negative terminal of the capacitor 6 to the load through the semiconductor switching element 10B. The potential of the load matches the potential at the negative terminal of the capacitor 6. Thus, the potential at the second main terminal 10A2 of the semiconductor switching element 10A is 0 [V], and the potential at the second main terminal 10B2 of the semiconductor switching element 10B is also 0 [V]. Moreover, a voltage of 0 [V] is applied to the impedance element group 16.

The power converter main circuit 10 transitions from the second state to the third state when the semiconductor switching element 10B is switched from off to on. However, there is no change in the potential of each part. The current path from the capacitor 6 to the load does not change, either.

In the third state, the semiconductor switching element 10A is off, and the semiconductor switching element 10B is on. At this point in time, a current flows from the negative terminal of the capacitor 6 to the load through the semiconductor switching element 10B. The potential of the load matches the potential at the negative terminal of the capacitor 6. Thus, the potential at the second main terminal 10A2 of the semiconductor switching element 10A is 0 [V], and the potential at the second main terminal 10B2 of the semiconductor switching element 10B is also 0 [V]. Moreover, a voltage of 0 [V] is applied to the impedance element group 16.

The power converter main circuit 10 transitions from the third state to the fourth state when the semiconductor switching element 10B is switched from on to off. However, there is no change in the potential of each part. The current path from the capacitor 6 to the load does not change, either.

In the fourth state, the semiconductor switching element 10A is off, and the semiconductor switching element 10B is off. At this point in time, a current flows from the negative terminal of the capacitor 6 to the load through the semiconductor switching element 10B. The potential of the load matches the potential at the negative terminal of the capacitor 6. Thus, the potential at the second main terminal 10A2 of the semiconductor switching element 10A is 0 [V], and the potential at the second main terminal 10B2 of the semiconductor switching element 10B is also 0 [V]. Moreover, a voltage of 0 [V] is applied to the impedance element group 16.

The power converter main circuit 10 transitions from the fourth state to the first state when the semiconductor switching element 10A is switched from off to on. This causes the potential of each part to change. The current path from the capacitor 6 to the load changes as well.

In the first state, the semiconductor switching element 10A is on, and the semiconductor switching element 10B is off. At this point in time, a current flows from the positive terminal of the capacitor 6 to the load through the semiconductor switching element 10A. The potential of the load matches the potential at the positive terminal of the capacitor 6. Thus, the potential at the second main terminal 10A2 of the semiconductor switching element 10A is 1000 [V]. The potential at the second main terminal 10B2 of the semiconductor switching element 10B is 0 [V]. Moreover, a voltage of 1000 [V] identical to the capacitor voltage is applied to the impedance element group 16.

FIG. 3 will now be referenced. When the load performs a source operation, the power converter main circuit 10 repeatedly performs the operation of changing the state from a fifth state to a sixth state, from the sixth state to a seventh state, from the seventh state to an eighth state, and from the eighth state to the fifth state as illustrated in FIG. 3.

In the fifth state, the semiconductor switching element 10A is on, and the semiconductor switching element 10B is off. At this point in time, a current flows from the load to the positive terminal of the capacitor 6 through the semiconductor switching element 10A. The potential of the load matches the potential at the positive terminal of the capacitor 6. The potential at the second main terminal 10A2 of the semiconductor switching element 10A is 1000 [V]. The potential at the second main terminal 10B2 of the semiconductor switching element 10B is 0 [V]. A voltage of 1000 [V] identical to the capacitor voltage is applied to the impedance element group 16.

The power converter main circuit 10 transitions from the fifth state to the sixth state when the semiconductor switching element 10A is switched from on to off. However, there is no change in the potential of each part. The current path from the load to the capacitor 6 does not change, either.

In the sixth state, the semiconductor switching element 10A is off, and the semiconductor switching element 10B is off. A current flows from the load to the positive terminal of the capacitor 6 through the semiconductor switching element 10A. The potential of the load matches the potential at the positive terminal of the capacitor 6. Thus, the potential at the second main terminal 10A2 of the semiconductor switching element 10A is 1000 [V], and the potential at the second main terminal 10B2 of the semiconductor switching element 10B is 0 [V]. Moreover, a voltage of 1000 [V] identical to the capacitor voltage is applied to the impedance element group 16.

The power converter main circuit 10 transitions from the sixth state to the seventh state when the semiconductor switching element 10B is switched from off to on. This causes the potential of each part to change. The current path from the load to the capacitor 6 changes as well.

In the seventh state, the semiconductor switching element 10A is off, and the semiconductor switching element 10B is on. At this point in time, a current flows from the load to the negative terminal of the capacitor 6 through the semiconductor switching element 10B. The potential of the load matches the potential at the negative terminal of the capacitor 6. Thus, the potential at the second main terminal 10A2 of the semiconductor switching element 10A is 0 [V], and the potential at the second main terminal 10B2 of the semiconductor switching element 10B is also 0 [V]. Moreover, a voltage of 0 [V] is applied to the impedance element group 16.

The power converter main circuit 10 transitions from the seventh state to the eighth state when the semiconductor switching element 10B is switched from on to off. This causes the potential of each part to change. The current path from the load to the capacitor 6 changes as well.

In the eighth state, the semiconductor switching element 10A is off, and the semiconductor switching element 10B is off. At this point in time, a current flows from the load to the positive terminal of the capacitor 6 through the semiconductor switching element 10A. The potential of the load matches the potential at the positive terminal of the capacitor 6. Thus, the potential at the second main terminal 10A2 of the semiconductor switching element 10A is 1000 [V]. The potential at the second main terminal 10B2 of the semiconductor switching element 10B is 0 [V]. A voltage of 1000 [V] identical to the capacitor voltage is applied to the impedance element group 16.

The power converter main circuit 10 transitions from the eighth state to the fifth state when the semiconductor switching element 10A is switched from off to on. However, there is no change in the potential of each part. The current path from the load to the capacitor 6 does not change, either.

In the fifth state, the semiconductor switching element 10A is on, and the semiconductor switching element 10B is off. At this point in time, a current flows from the load to the positive terminal of the capacitor 6 through the semiconductor switching element 10A. The potential of the load matches the potential at the positive terminal of the capacitor 6. Thus, the potential at the second main terminal 10A2 of the semiconductor switching element 10A is 1000 [V]. The potential at the second main terminal 10B2 of the semiconductor switching element 10B is 0 [V]. Moreover, a voltage of 1000 [V] identical to the capacitor voltage is applied to the impedance element group 16.

Next, the operation of the power converter with a focus on the state of the power converter main circuit will be described with reference to FIGS. 1 to 3 as appropriate.

First, the description focuses on the gate drive circuit 12A at the time of transition from the first state to the second state. As for the drawings, reference is made to FIGS. 1 and 2.

In the first state, a voltage of 1000 [V] identical to the capacitor voltage is applied to the impedance element group 16. The detector 12A4 included in the gate drive circuit 12A detects the voltage across the impedance element group 16 and transmits information on the detected capacitor voltage, namely the capacitor voltage information, to the switching speed changing unit 12A3. The switching speed changing unit 12A3 included in the gate drive circuit 12A can know the capacitor voltage from the voltage between the gate drive circuit 12A and the gate drive circuit 12B.

When determining that the voltage between the gate drive circuit 12A and the gate drive circuit 12B is lower than the reference voltage, the switching speed changing unit 12A3 performs control to increase the driving speed for turning off the semiconductor switching element 10A. This control can reduce or prevent a switching loss at turn-off. Note that although the control for increasing the driving speed increases the surge voltage generated at turn-off, the capacitor voltage is low, so that no excessive voltage is applied to the components inside the power converter main circuit 10.

The power converter main circuit 10 thus transitions from the first state to the second state.

Next, the description focuses on the gate drive circuit 12B at the time of transition from the sixth state to the seventh state. As for the drawings, reference is made to FIGS. 1 and 3. In the sixth state, a voltage of 1000 [V] identical to the capacitor voltage is applied to the impedance element group 16. The detector 12B4 included in the gate drive circuit 12B detects the voltage across the impedance element group 16 and transmits the detected capacitor voltage information to the switching speed changing unit 12B3. The switching speed changing unit 12B3 included in the gate drive circuit 12B can know the capacitor voltage from the voltage between the gate drive circuit 12B and the gate drive circuit 12A.

When determining that the voltage between the gate drive circuit 12B and the gate drive circuit 12A is lower than the reference voltage, the switching speed changing unit 12B3 performs control to increase the driving speed for turning on the semiconductor switching element 10B. This control can reduce or prevent a switching loss at turn-on. Note that although the surge voltage generated at turn-on is increased, the capacitor voltage is low, so that no excessive voltage is applied to the components inside the power converter main circuit 10. The power converter main circuit 10 thus transitions from the sixth state to the seventh state.

Figure 4:
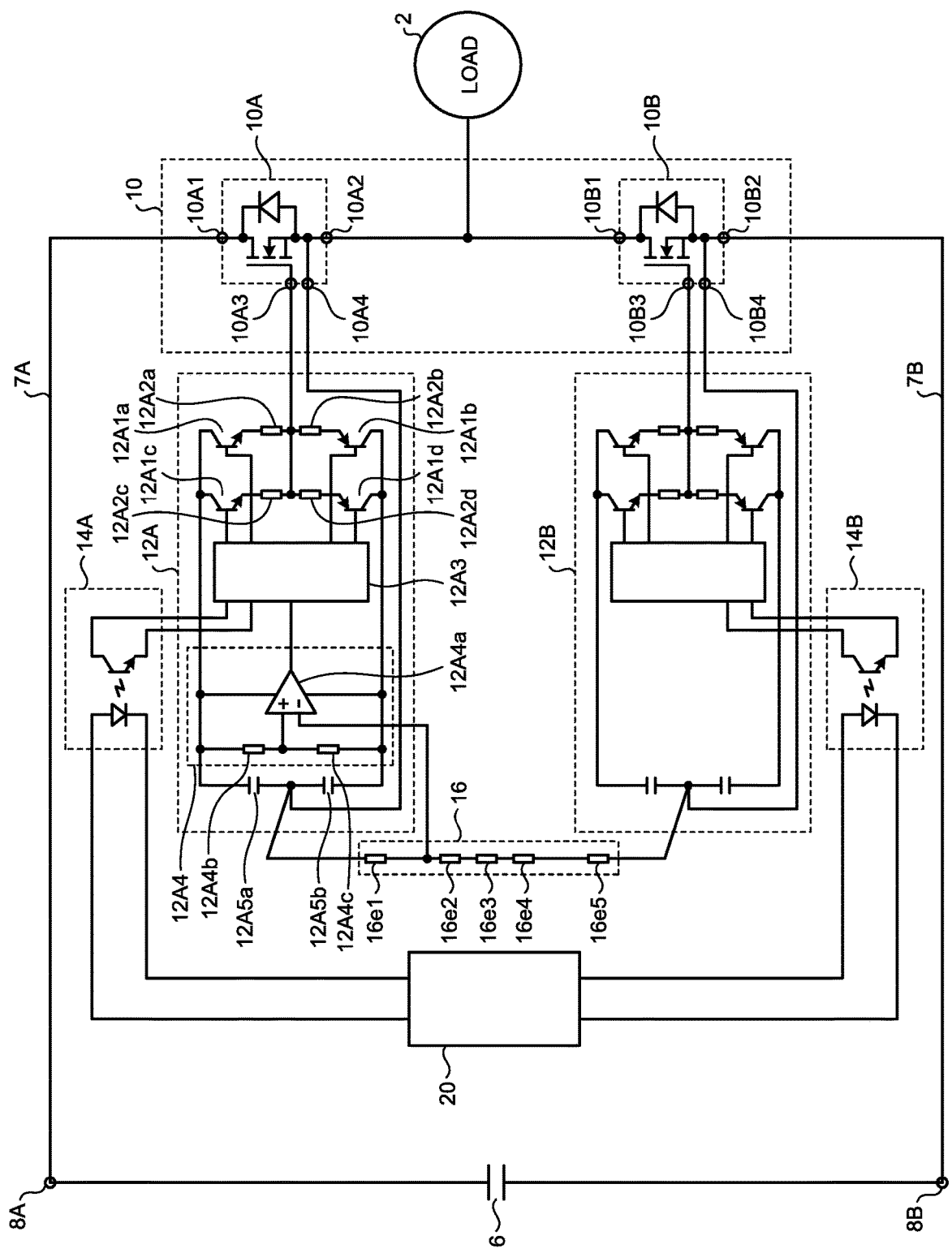
FIG. 4 is a circuit diagram illustrating the configuration in which a detector is provided in only one gate drive circuit as a modification of the power converter according to the first embodiment.

Note that although FIG. 1 illustrates the configuration in which the detectors 12A4 and 12B4 are respectively provided in the gate drive circuits 12A and 12B, the detector may be provided in only one of the gate drive circuits 12A and 12B. For example, FIG. 4 illustrates a configuration in which the detector 12A4 is provided only in the gate drive circuit 12A, where the configuration as illustrated in FIG. 4 can also obtain the effect described above.

According to the power converter of the first embodiment described above, one or a plurality of the impedance elements are connected between at least a pair of the gate drive circuits among the gate drive circuits driving corresponding ones of two or more of the semiconductor switching elements included in the power converter main circuit, at least one of the gate drive circuits is provided with the detector detecting the voltage across the impedance elements or the current flowing therethrough, and the output of the detector is transmitted to the gate drive circuit, whereby the influence of noise can be reduced when the voltage information on each part of the power converter is transmitted to the gate drive circuit.

Moreover, according to the power converter of the first embodiment, the driving speed of the semiconductor switching element is changed in accordance with the output of the detector indicating the capacitor voltage, whereby generation of an excessive voltage in the components inside the power converter main circuit can be prevented.

Second Embodiment

Figure 5:
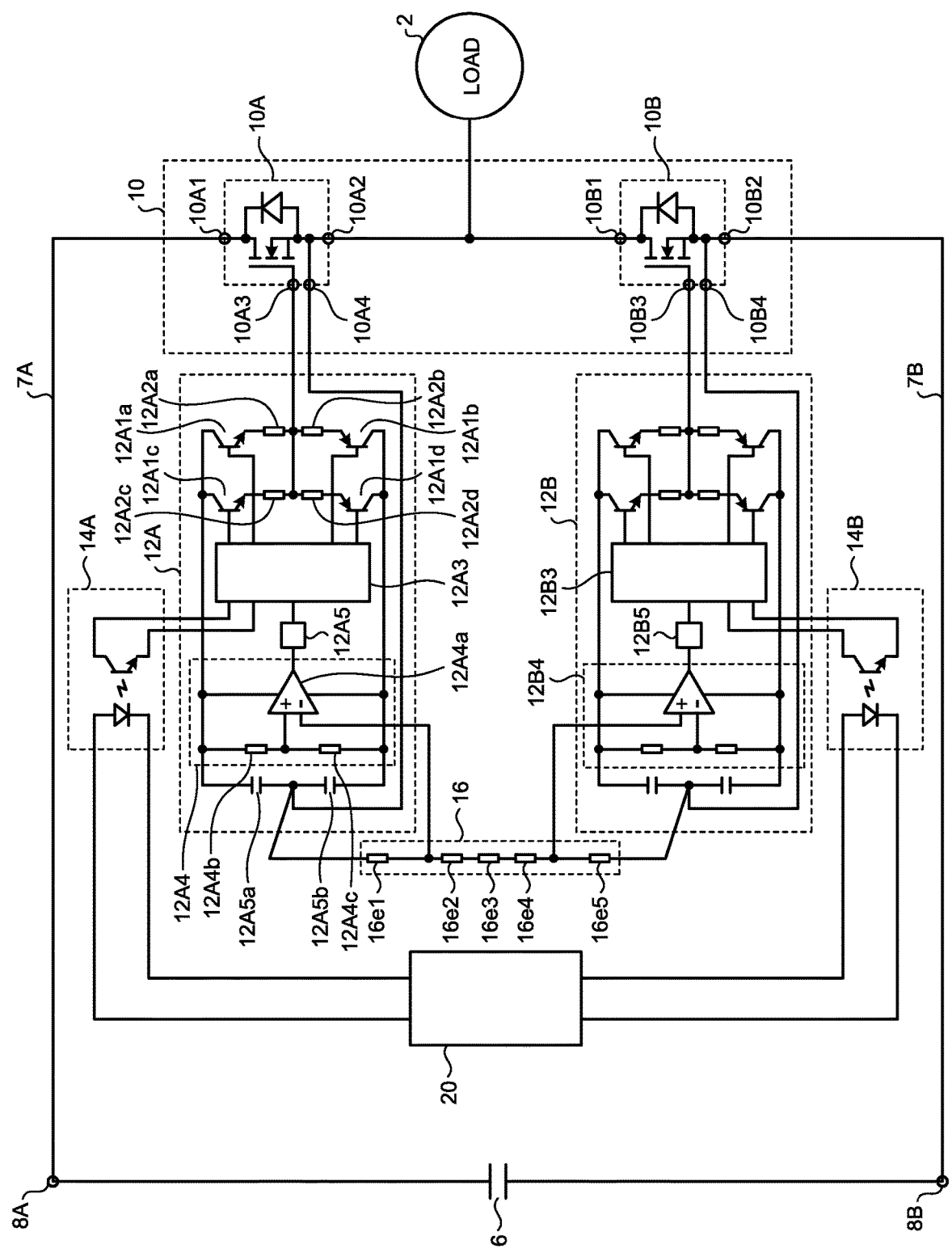
FIG. 5 is a circuit diagram illustrating the configuration of a main part of a power converter according to a second embodiment.

FIG. 5 is a circuit diagram illustrating the configuration of a main part of a power converter according to a second embodiment. The power converter according to the second embodiment illustrated in FIG. 5 discloses a configuration in which storages 12A5 and 12B5 are included in the gate drive circuits 12A and 12B, respectively, in the configuration of the power converter according to the first embodiment illustrated in FIG. 1. According to FIG. 5, the storage 12A5 is added between the detector 12A4 and the switching speed changing unit 12A3, and the storage 12B5 is added between the detector 12B4 and the switching speed changing unit 12B3. Note that the other components are identical or equivalent to those in FIG. 1 and are thus denoted by the same reference numerals as those in FIG. 1, whereby a redundant description will be omitted.

The detector 12A4 provided in the gate drive circuit 12A in FIG. 5 determines the magnitude relationship between the voltage across the impedance element group 16 representing the capacitor voltage information and the reference voltage, and transmits the result of the determination to the storage 12A5. The storage 12A5 stores determination information as to whether the capacitor voltage is lower or higher than the reference voltage. The storage 12A5 may be any means capable of storing the capacitor voltage information, and can include a voltage storage element, a latch circuit, or the like.

The storage 12A5 acts on the switching speed changing unit 12A3, which changes the driving speed of the semiconductor switching element 10A on the basis of the determination information stored in the storage 12A5.

Note that an operating power supply for operating the detector 12A4 and the storage 12A5 can also be used as a power supply for driving the gate drive circuit. A dedicated power supply for operating the detector 12A4 and the storage 12A5 need not be provided if the power supply therefor is also used as the power supply for driving the gate drive circuit.

Next, the operation of the main part of the power converter according to the second embodiment will be described while focusing on the operation of the gate drive circuit 12A in the first state of FIG. 2. As for the drawings, reference is made to FIGS. 2 and 5.

In the first state, a voltage of 1000 [V] identical to the capacitor voltage is applied to the impedance element group 16. The detector 12A4 determines the magnitude relationship between the voltage from the impedance element group 16 and the reference voltage. When the detector 12A4 determines that the voltage from the impedance element group 16 is lower than the reference voltage, the result of the determination is stored in the storage 12A5.

The switching speed changing unit 12A3 switches control to one that increases the driving speed of the semiconductor switching element 10A on the basis of the information determined to be lower than the reference voltage and stored in the storage 12A5. This control prevents a turn-off switching loss of the semiconductor switching element 10A at the time of transition from the first state to the second state. A turn-on switching loss of the semiconductor switching element 10A can also be prevented at the time of transition from the fourth state to the first state. Note that although the above control increases the surge voltage generated at the time of switching, the capacitor voltage is low, so that no excessive voltage is applied to the components inside the power converter main circuit 10.

On the other hand, when the detector 12A4 determines that the voltage from the impedance element group 16 is higher than the reference voltage in the first state, the result of the determination is stored in the storage 12A5. Information stored in the storage 12A5 is overwritten with a new result of the determination. That is, the latest result of the determination is stored in the storage 12A5.

The switching speed changing unit 12A3 switches control to one that reduces the driving speed of the semiconductor switching element 10A on the basis of the information determined to be higher than the reference voltage and stored in the storage 12A5. Although the capacitor voltage is high, this control reduces the surge voltage generated at the time of switching to be able to prevent application of an excessive voltage to the components inside the power converter main circuit 10.

Next, the description focuses on the operation of the gate drive circuit 12B in the fifth, sixth, and eighth states of FIG. 3. As for the drawings, reference is made to FIGS. 3 and 5.

In each of the fifth, sixth, and eighth states, a voltage of 1000 [V] identical to the capacitor voltage is applied to the impedance element group 16. The detector 12B4 determines the magnitude relationship between the voltage from the impedance element group 16 and the reference voltage. When the detector 12B4 determines that the voltage from the impedance element group 16 is lower than the reference voltage, the result of the determination is stored in the storage 12B5.

The switching speed changing unit 12B3 switches control to one that increases the driving speed of the semiconductor switching element 10B on the basis of the information determined to be lower than the reference voltage and stored in the storage 12B5. This control prevents a turn-off switching loss of the semiconductor switching element 10B at the time of transition from the sixth state to the seventh state. A turn-off switching loss of the semiconductor switching element 10B can also be prevented at the time of transition from the seventh state to the eighth state. Note that although the above control increases the surge voltage generated at the time of switching, the capacitor voltage is low, so that no excessive voltage is applied to the components inside the power converter main circuit 10.

On the other hand, when the detector 12B4 determines that the voltage from the impedance element group 16 is higher than the reference voltage in each of the fifth, sixth, and eighth states, the result of the determination is stored in the storage 12B5. Information stored in the storage 12B5 is overwritten with a new result of the determination. That is, the latest result of the determination is stored in the storage 12B5.

The switching speed changing unit 12B3 switches control to one that reduces the driving speed of the semiconductor switching element 10B on the basis of the information determined to be higher than the reference voltage and stored in the storage 12B5. Although the capacitor voltage is high, this control reduces the surge voltage generated at the time of switching to be able to prevent application of an excessive voltage to the components inside the power converter main circuit 10.

Note that although FIG. 5 illustrates the configuration in which the storages 12A5 and 12B5 are respectively provided in the gate drive circuits 12A and 12B, the aforementioned effect can also be obtained by provision of the storage in only one of the gate drive circuits 12A and 12B. When one of the storages 12A5 and 12B5 is omitted, the detector corresponding to the omitted detector 12A4 or 12B4 can be omitted in accordance with the omission of the storage.

Third Embodiment

Figure 6:
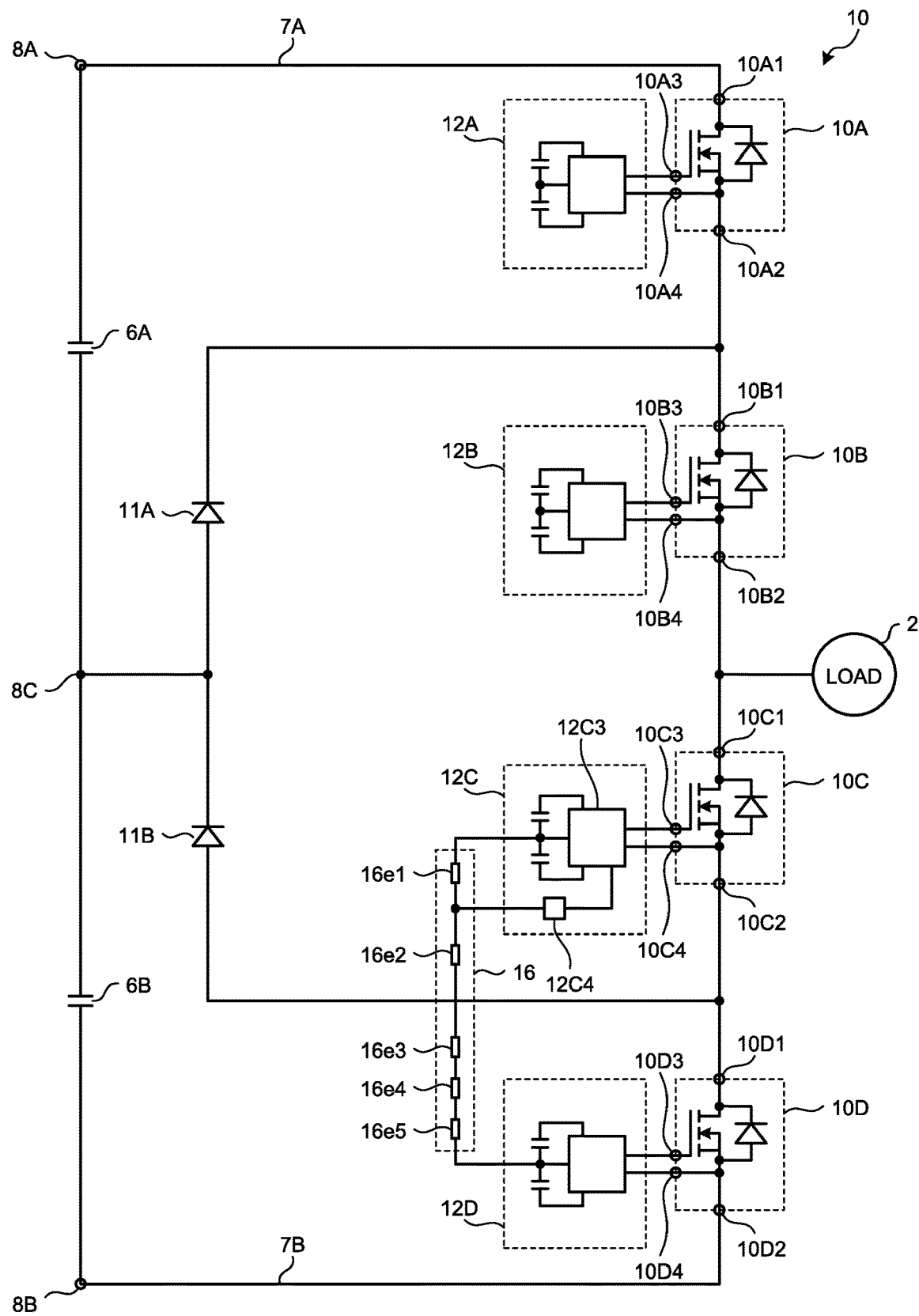
FIG. 6 is a circuit diagram illustrating the configuration of a main part of a power converter according to a third embodiment.

FIG. 6 is a circuit diagram illustrating the configuration of a main part of a power converter according to a third embodiment. As the configuration of the main part of the power converter according to the third embodiment, FIG. 6 illustrates the load 2 to be driven; the power converter main circuit 10 that drives the load 2; gate drive circuits 12A, 12B, 12C, and 12D that are peripheral circuits that control the power converter main circuit 10; the impedance element group 16 outputting the capacitor voltage information; and capacitors 6A and 6B, each of which is a power supply source for the power converter main circuit 10 and accumulates DC power.

In the power converter according to the third embodiment, the two capacitors 6A and 6B for accumulating DC voltage are connected in series to provide three terminals that are the upper DC terminal 8A, an intermediate DC terminal 8C, and the lower DC terminal 8B in the descending order from one having a higher potential. The DC bus 7A on the high potential side is electrically connected to the upper DC terminal 8A, and the DC bus 7B on the low potential side is electrically connected to the lower DC terminal 8B.

From the DC bus 7A on the high potential side to the DC bus 7B on the low potential side, the power converter main circuit 10 according to the third embodiment includes the semiconductor switching element 10A as the first power semiconductor switching element; the semiconductor switching element 10B as the second power semiconductor switching element; a semiconductor switching element 10C as a third power semiconductor switching element; and a semiconductor switching element 10D as a fourth power semiconductor switching element that are connected in series in this order. The power converter main circuit 10 according to the third embodiment is further provided with a clamping diode 11A as a first diode element, a cathode of which is electrically connected to a connection point of the semiconductor switching element 10A and the semiconductor switching element 10B while an anode of which is electrically connected to the intermediate DC terminal 8C; and a clamping diode 11B as a second diode element, a cathode of which is electrically connected to the intermediate DC terminal 8C while an anode of which is electrically connected to a connection point of the semiconductor switching element 10C and the semiconductor switching element 10D. Note that the load 2 is connected to the electrical connection point of the semiconductor switching element 10B and the semiconductor switching element 10C.

The semiconductor switching element 10A is provided with the first main terminal 10A1, the second main terminal 10A2, the first signal input terminal 10A3, and the second signal input terminal 10A4. The same applies to the semiconductor switching elements 10B, 10C, and 10D, where the semiconductor switching element 10B is provided with the first main terminal 10B1, the second main terminal 10B2, the first signal input terminal 10B3, and the second signal input terminal 10B4, the semiconductor switching element 10C is provided with a first main terminal 10C1, a second main terminal 10C2, a first signal input terminal 10C3, and a second signal input terminal 10C4, and the semiconductor switching element 10D is provided with a first main terminal 10D1, a second main terminal 10D2, a first signal input terminal 10D3, and a second signal input terminal 10D4.

In the power converter main circuit 10 connected as described above, the potential of the upper DC terminal 8A is applied to the load 2 when the semiconductor switching elements 10A and 10B become conductive, and the potential of the lower DC terminal 8B is applied to the load 2 when the semiconductor switching elements 10C and 10D become conductive. The potential of the intermediate DC terminal 8C is applied to the load 2 when either one of the semiconductor switching elements 10B and 10C becomes conductive while the semiconductor switching elements 10A and 10D are non-conductive. The power converter main circuit 10 thus outputs three kinds of potentials that are the potential of the upper DC terminal 8A, the potential of the intermediate DC terminal 8C, and the potential of the lower DC terminal 8B, thereby operating as a three-level power converter circuit.

When AC power is supplied to the load 2, the semiconductor switching elements 10A and 10B and the semiconductor switching elements 10C and 10D operate symmetrically, and the two capacitors 6A and 6B store equal DC voltage.

Although FIG. 6 illustrates a MOSFET as the transistor element, the transistor element is not limited to the MOSFET but may be any device that can switch a state between a low resistance state and a high resistance state by an electrical signal. For example, an IGBT or a bipolar transistor may be used as the transistor element. Moreover, a wide band-gap semiconductor such as SiC, GaN, or diamond in addition to Si which is used widely may be used as a material of the transistor element and the diode element making up each of the semiconductor switching elements 10A to 10D.

The gate drive circuit 12A is the first gate drive circuit that drives the semiconductor switching element 10A that is the first power semiconductor switching element. Likewise, the gate drive circuit 12B is the second gate drive circuit that drives the semiconductor switching element 10B that is the second power semiconductor switching element, the gate drive circuit 12C is a third gate drive circuit that drives the semiconductor switching element 10C that is the third power semiconductor switching element, and the gate drive circuit 12D is a fourth gate drive circuit that drives the semiconductor switching element 10D that is the fourth power semiconductor switching element.

Here, among the gate drive circuits 12A to 12D illustrated in FIG. 6, the configuration of the gate drive circuit 12C is identical or equivalent to the configuration of the gate drive circuit 12A according to the first embodiment illustrated in FIG. 1. On the other hand, the configuration of each of the gate drive circuits 12B and 12D omits the detector 12A4 from the configuration of the gate drive circuit 12A illustrated in FIG. 1, and is identical or equivalent to the configuration of the gate drive circuit 12B illustrated in FIG. 4. Note that in FIG. 6, a component identical or equivalent to a component illustrated in FIG. 1 is denoted by the same reference numeral as that assigned to the component in FIG. 1. Moreover, FIG. 6 omits illustration of components corresponding to the insulating circuits 14A and 14B and the switching signal generation unit 20 which are illustrated in FIG. 1.

As with the first embodiment, the voltage generated across the impedance element group 16 or the current flowing therethrough represents a potential difference between the second main terminal 10C2 of the semiconductor switching element 10C and the second main terminal 10D2 of the semiconductor switching element 10D. The gate drive circuit 12C can thus know the potential difference between the second main terminal 10C2 of the semiconductor switching element 10C and the second main terminal 10D2 of the semiconductor switching element 10D by detecting the voltage or the current across the impedance element group 16.

Next, the operation of the power converter according to the third embodiment will be described. Note that the operation of the gate drive circuit will be described with reference to the gate drive circuit 12C that includes a switching speed changing unit 12C3 and a detector 12C4. The potential of the intermediate DC terminal 8C is set to the reference potential (0 [V]), and the voltage stored in each of the capacitors 6A and 6B is set to 1000 [V]. Accordingly, the potential of the upper DC terminal 8A is +1000 [V], the potential of the intermediate DC terminal 8C is 0 [V], and the potential of the lower DC terminal 8B is −1000 [V].

Figure 7:
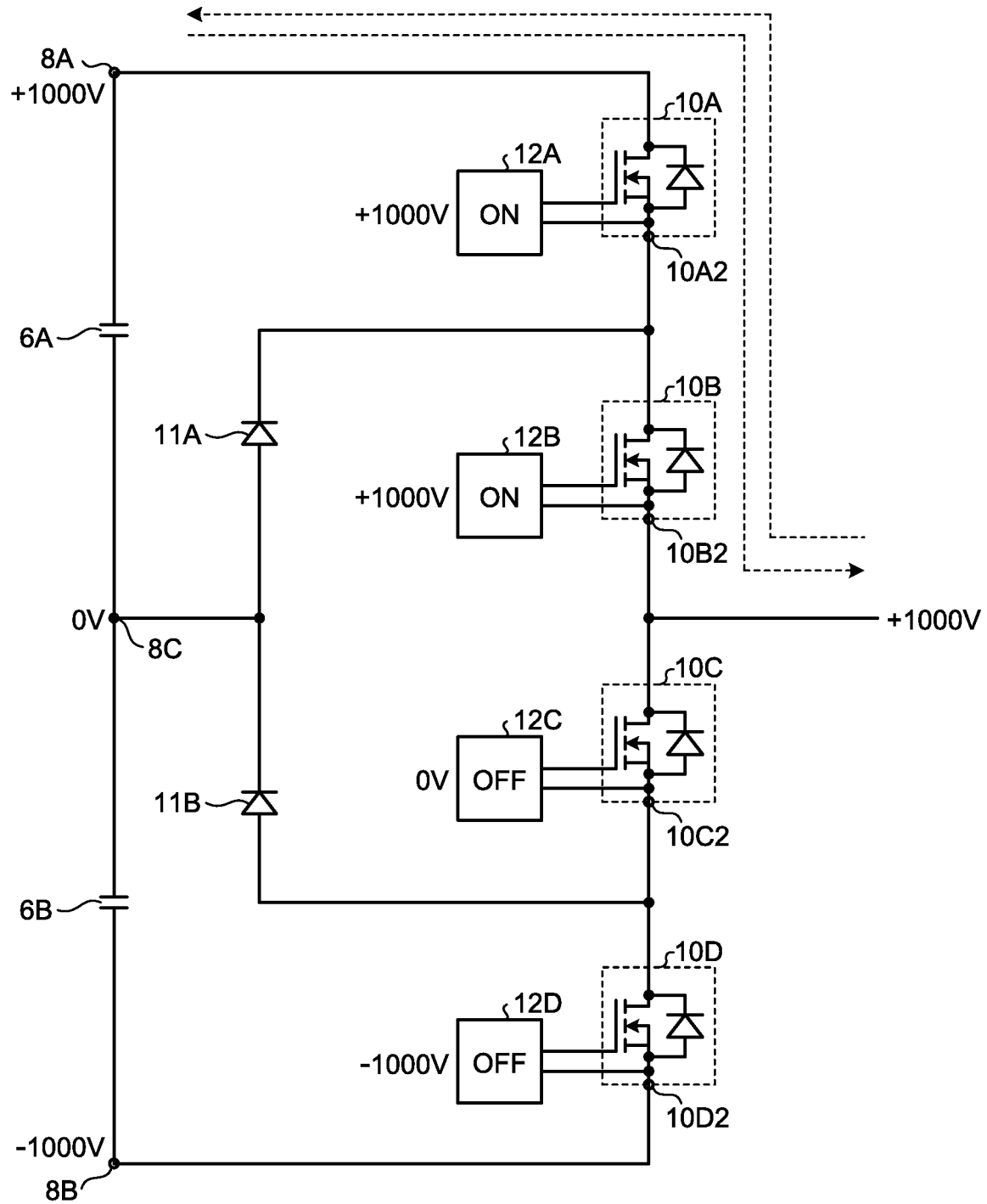
FIG. 7 is a circuit diagram illustrating one mode of the operation of the power converter according to the third embodiment.

FIG. 7 is a circuit diagram illustrating one mode of the operation of the power converter according to the third embodiment. FIG. 7 illustrates the mode in which the semiconductor switching elements 10A and 10B are on, the semiconductor switching elements 10C and 10D are off, and the potential of the load (not illustrated) matches the potential of the upper DC terminal 8A. At this point in time, a current flows between the upper DC terminal 8A and the load via the semiconductor switching elements 10A and 10B. Thus, the potential at the second main terminal 10A2 of the semiconductor switching element 10A is +1000 [V], and the potential at the second main terminal 10B2 of the semiconductor switching element 10B is also +1000 [V]. The potential at the second main terminal 10C2 of the semiconductor switching element 10C is 0 [V], and the potential at the second main terminal 10D2 of the semiconductor switching element 10D is −1000 [V].

Figure 8:
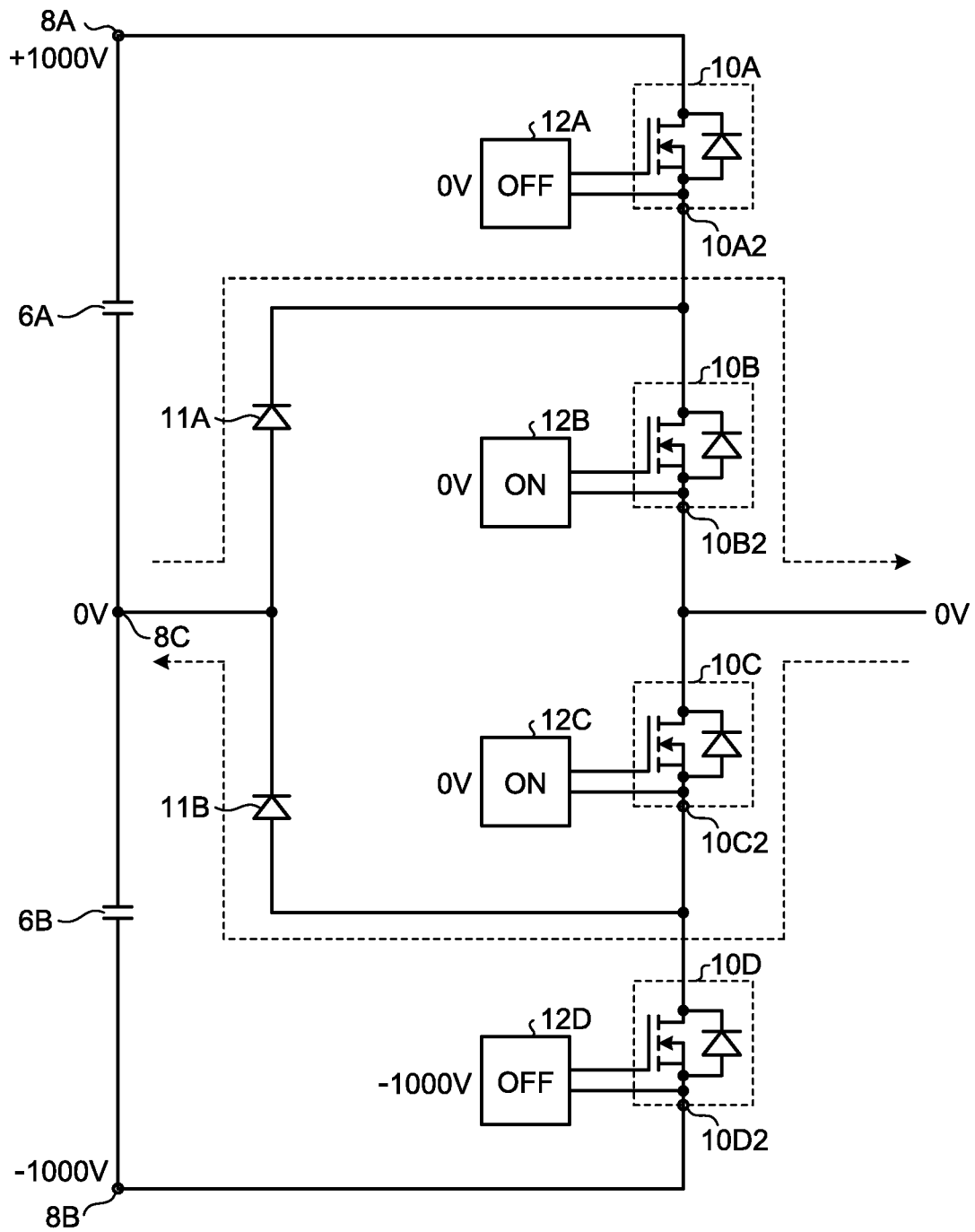
FIG. 8 is a circuit diagram illustrating a mode of the operation of the power converter according to the third embodiment, the mode being different from that of FIG. 7.

FIG. 8 is a circuit diagram illustrating one mode of the operation of the power converter according to the third embodiment, the mode being different from that of FIG. 7. FIG. 8 illustrates the mode in which the semiconductor switching elements 10A and 10D are off, the semiconductor switching elements 10B and 10C are on, and the potential of the load matches the potential of the intermediate DC terminal 8C. At this point in time, a current flows between the intermediate DC terminal 8C and the load via the semiconductor switching elements 10B and 10C. Thus, the potential at the second main terminal 10A2 of the semiconductor switching element 10A is 0 [V], the potential at the second main terminal 10B2 of the semiconductor switching element 10B is 0 [V], and the potential at the second main terminal 10C2 of the semiconductor switching element 10C is also 0 [V]. On the other hand, the potential at the second main terminal 10D2 of the semiconductor switching element 10D is −1000 [V].

Figure 9:
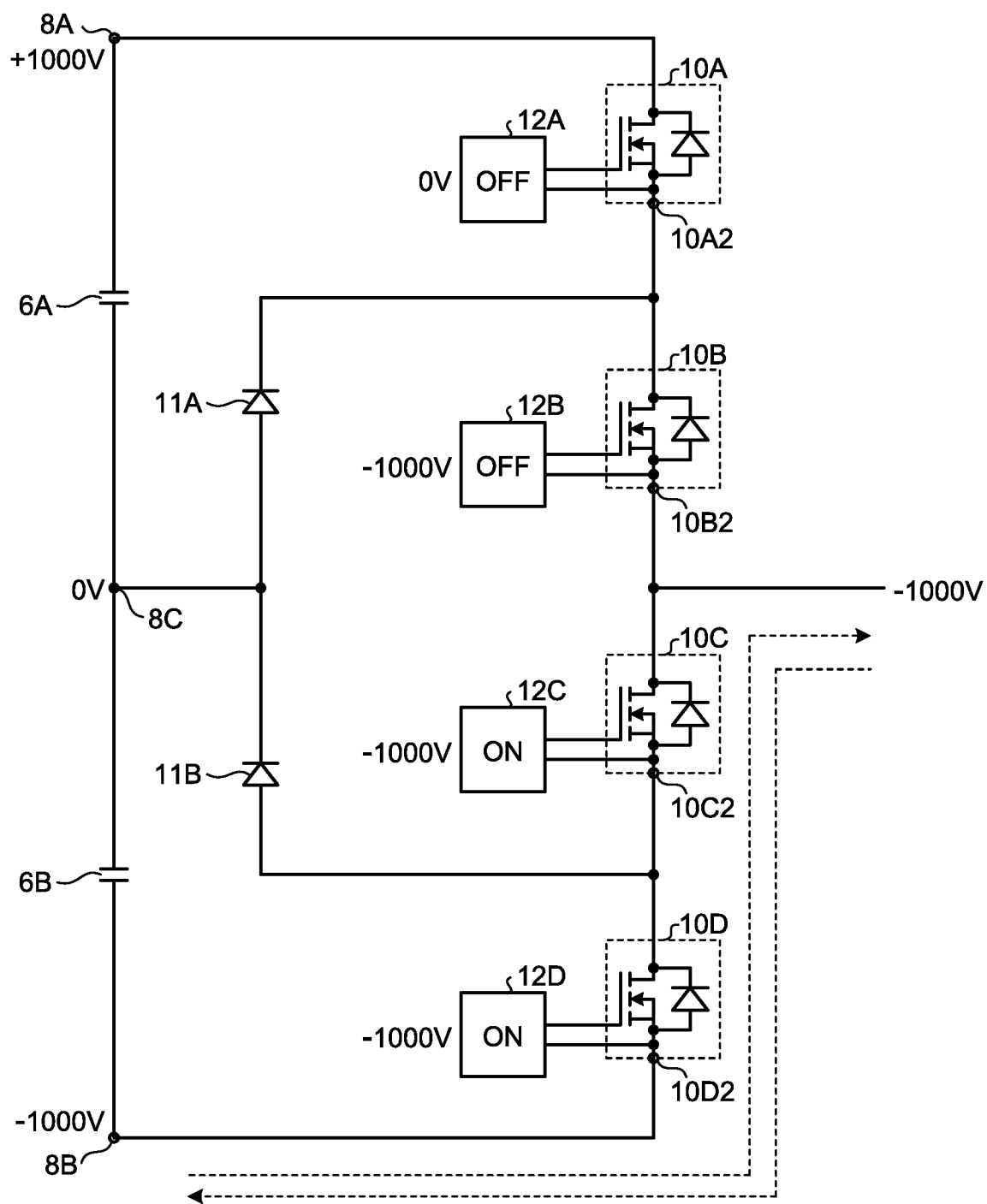
FIG. 9 is a circuit diagram illustrating a mode of the operation of the power converter according to the third embodiment, the mode being different from that of each of FIGS. 7 and 8.

FIG. 9 is a circuit diagram illustrating one mode of the operation of the power converter according to the third embodiment, the mode being different from that of each of FIGS. 7 and 8. FIG. 9 illustrates the mode in which the semiconductor switching elements 10A and 10B are off, the semiconductor switching elements 10C and 10D are on, and the potential of the load matches the potential of the lower DC terminal 8B. At this point in time, a current flows between the lower DC terminal 8B and the load via the semiconductor switching elements 10C and 10D. Thus, the potential at the second main terminal 10A2 of the semiconductor switching element 10A is 0 [V]. On the other hand, the potential at the second main terminal 10B2 of the semiconductor switching element 10B is −1000 [V], the potential at the second main terminal 10C2 of the semiconductor switching element 10C is −1000 [V], and the potential at the second main terminal 10D2 of the semiconductor switching element 10D is also −1000 [V].

The switching operation of the semiconductor switching elements 10A to 10D generates a surge voltage, which is known to be particularly large when the following two operations are performed in the three-level circuit.

A first operation refers to a case where the load receives a current, namely performs a sink operation, and is an operation in which the semiconductor switching element 10B that is the second power semiconductor switching element performs a switching operation to cause switching of the state between the state in FIG. 8 and the state in FIG. 9. A second operation refers to a case where the load discharges a current, namely performs a source operation, and is an operation in which the semiconductor switching element 10C that is the third power semiconductor switching element performs a switching operation to cause switching of the state between the state in FIG. 7 and the state in FIG. 8. These operations involve a particularly large change in the current path and are thus known to cause generation of a particularly large surge voltage.

The description will focus on the operation in which the semiconductor switching element 10C that is the third power semiconductor switching element performs a switching operation to cause switching of the state between the state in FIG. 7 and the state in FIG. 8 when the load discharges a current.

With the configuration illustrated in FIG. 6, a voltage of 1000 [V] identical to the capacitor voltage is applied across the impedance element group 16 in the states of FIGS. 7 and 8. The detector 12C4 included in the third gate drive circuit 12C detects the voltage across the impedance element group 16. The gate drive circuit 12C can thus know the voltage between the gate drive circuit 12C and the gate drive circuit 12D, or the capacitor voltage.

When determining that the voltage between the third gate drive circuit 12C and the fourth gate drive circuit 12D is lower than the reference voltage, the third gate drive circuit 12C switches control to one that increases the driving speed for turning on and off the semiconductor switching element 10C. The increase in the driving speed can prevent a turn-on switching loss and a turn-off switching loss. Although the surge voltage generated at the time of switching increases, the capacitor voltage is low, so that no excessive voltage is applied to the components inside the power converter main circuit 10.

On the other hand, when determining that the voltage between the third gate drive circuit 12C and the fourth gate drive circuit 12D is higher than the reference voltage, the third gate drive circuit 12C switches control to one that reduces the driving speed for turning on and off the semiconductor switching element 10C. Although the capacitor voltage is high, the decrease in the driving speed reduces the surge voltage generated at the time of switching of turn-on and turn-off to be able to prevent application of an excessive voltage to the components inside the power converter main circuit 10.

Figure 10:
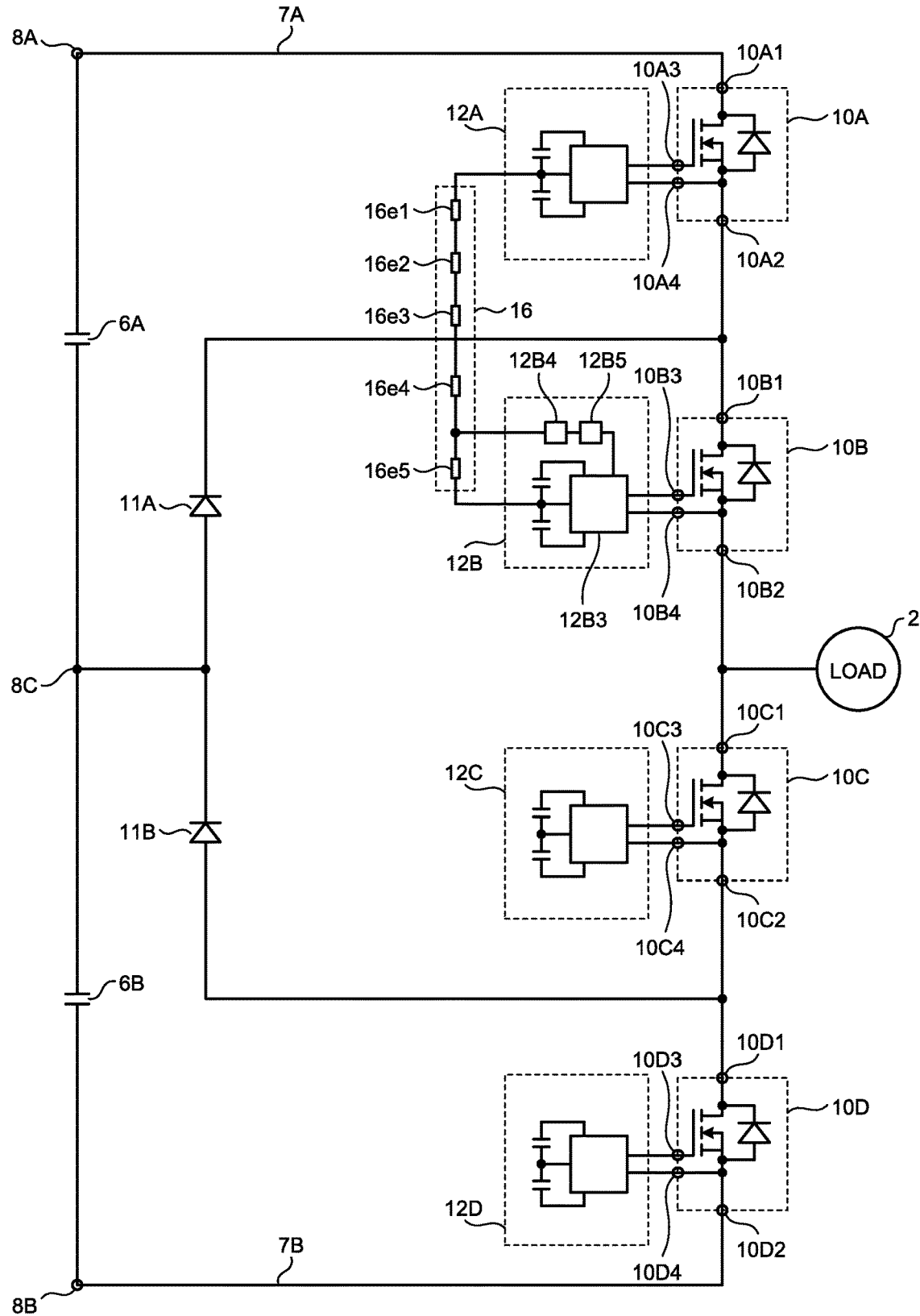
FIG. 10 is a circuit diagram illustrating the configuration of a main part of the power converter according to the third embodiment, the configuration being different from that of FIG. 6.

FIG. 10 is a circuit diagram illustrating the configuration of a main part of the power converter according to the third embodiment, the configuration being different from that of FIG. 6. The characteristic of the configuration illustrated in FIG. 10 is that the impedance element group 16 is connected between the gate drive circuit 12A that is the first gate drive circuit and the gate drive circuit 12B that is the second gate drive circuit, and that the gate drive circuit 12B that is the second gate drive circuit includes the detector 12B4 and the storage 12B5. Note that the storage 12B5 can be omitted.

Next, the operation of the main part of the power converter illustrated in FIG. 10 will be described while focusing on the operation of the semiconductor switching element 10B that is the second power semiconductor switching element when the load receives a current, or performs a sink operation. As for the drawings, reference is made to FIGS. 8 and 9.

In the state illustrated in FIG. 9, a voltage of 1000 [V] identical to the capacitor voltage is applied to the impedance element group 16. The detector 12B4 included in the gate drive circuit 12B determines the magnitude relationship between the voltage across the impedance element group 16 representing the capacitor voltage information and the reference voltage, and transmits the result of the determination to the storage 12B5. The storage 12B5 stores determination information as to whether the capacitor voltage is lower or higher than the reference voltage.

The storage 12B5 acts on the switching speed changing unit 12B3, which changes the driving speed of the semiconductor switching element 10B on the basis of the determination information stored in the storage 12B5.

When the detector 12B4 determines that the voltage from the impedance element group 16 is lower than the reference voltage, the result of the determination is stored in the storage 12B5.

The switching speed changing unit 12B3 switches control to one that increases the driving speed of the semiconductor switching element 10B on the basis of the information determined to be lower than the reference voltage and stored in the storage 12B5. This control prevents a switching loss of the semiconductor switching element 10B. Note that although the above control increases the surge voltage generated at the time of switching, the capacitor voltage is low, so that no excessive voltage is applied to the components inside the power converter main circuit 10.

On the other hand, when the detector 12B4 determines that the voltage from the impedance element group 16 is higher than the reference voltage, the result of the determination is stored in the storage 12B5. Information stored in the storage 12B5 is overwritten with a new result of the determination. That is, the latest result of the determination is stored in the storage 12B5.

The switching speed changing unit 12B3 switches control to one that reduces the driving speed of the semiconductor switching element 10B on the basis of the information determined to be higher than the reference voltage and stored in the storage 12B5. Although the capacitor voltage is high, this control reduces the surge voltage generated at the time of switching to be able to prevent application of an excessive voltage to the components inside the power converter main circuit 10.

Figure 11:
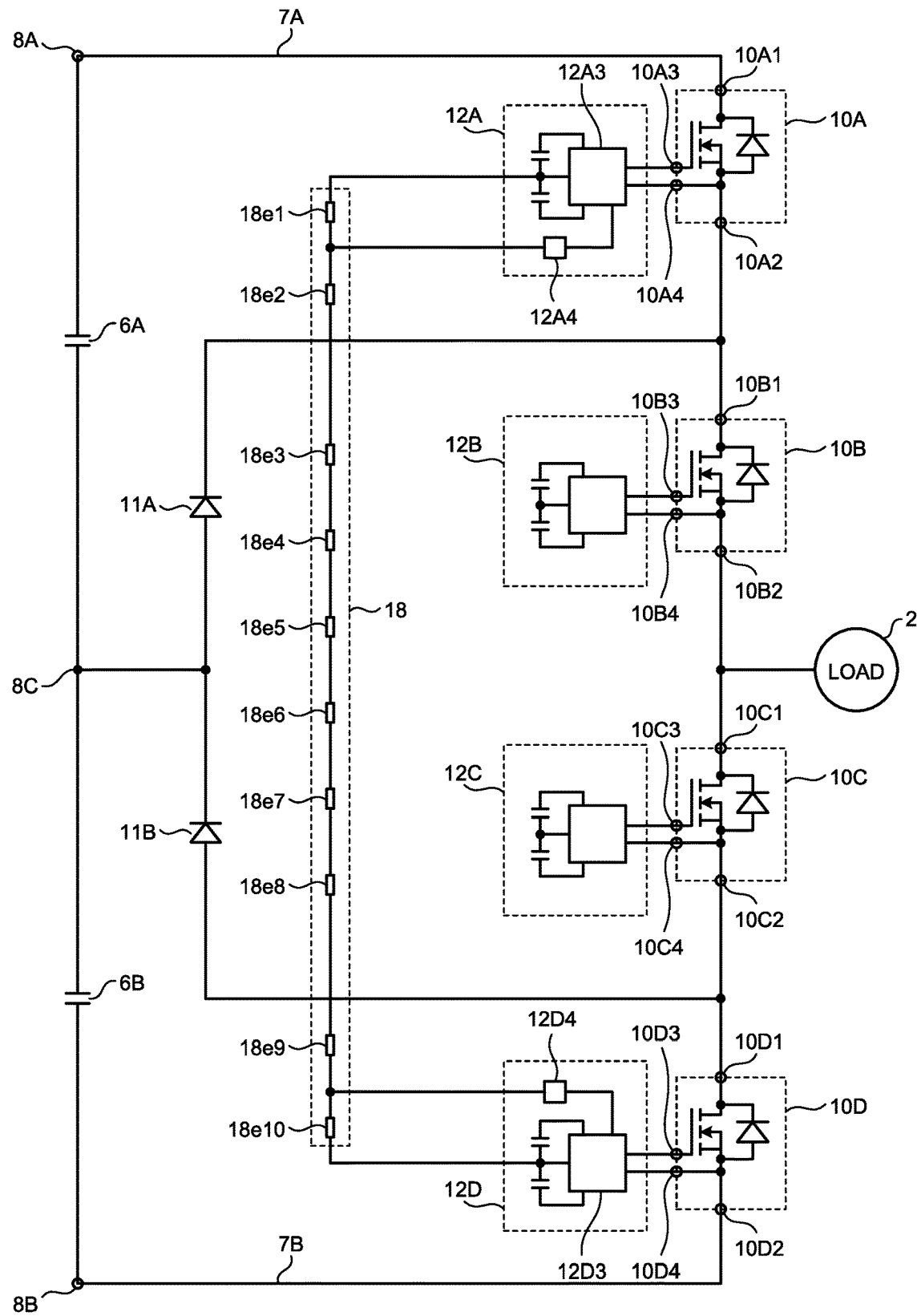
FIG. 11 is a circuit diagram illustrating the configuration of a main part of the power converter according to the third embodiment, the configuration being different from that of each of FIGS. 6 and 10.

FIG. 11 is a circuit diagram illustrating the configuration of a main part of the power converter according to the third embodiment, the configuration being different from that of each of FIGS. 6 and 10. The characteristic of the configuration illustrated in FIG. 11 is that an impedance element group 18 is connected between the gate drive circuit 12A that is the first gate drive circuit and the gate drive circuit 12D that is the fourth gate drive circuit, the gate drive circuit 12A that is the first gate drive circuit includes the detector 12A4, and the gate drive circuit 12D that is the fourth gate drive circuit includes a detector 12D4. Note that a storage can also be included as in FIG. 10.

With the configuration illustrated in FIG. 11, a voltage of 2000 [V] corresponding to the voltage of the two capacitors 6A and 6B is applied across the impedance element group 18 in the state of FIG. 7. For this reason, the impedance element group 18 in the configuration illustrated in FIG. 11 includes impedance elements twice as many as the case of FIG. 6, or includes ten impedance elements 18e1 to 18e10. Note that in the state illustrated in each of FIGS. 8 and 9, a voltage of 1000 [V] corresponding to the voltage of one capacitor is applied.

The detectors 12A4 and 12D4 included in the gate drive circuits 12A and 12D, respectively, can know the capacitor voltage on the basis of voltage information or current information output from the impedance element group 18. The switching speed changing unit 12A3 provided in the gate drive circuit 12A performs control to switch or change the driving speed of the semiconductor switching element 10A, and a switching speed changing unit 12D3 provided in the gate drive circuit 12D performs control to switch or change the driving speed of the semiconductor switching element 10D.

When determining that the capacitor voltage is low, the gate drive circuit 12A switches control to one that increases the driving speed for turning on and off the semiconductor switching element 10A. Similarly, when determining that the capacitor voltage is low, the gate drive circuit 12D switches control to one that increases the driving speed for turning on and off the semiconductor switching element 10D. The increase in the driving speed can prevent a turn-on switching loss and a turn-off switching loss. Note that although the above control increases the surge voltage generated at the time of switching, the capacitor voltage is low, so that no excessive voltage is applied to the components inside the power converter main circuit 10.

Figure 12:
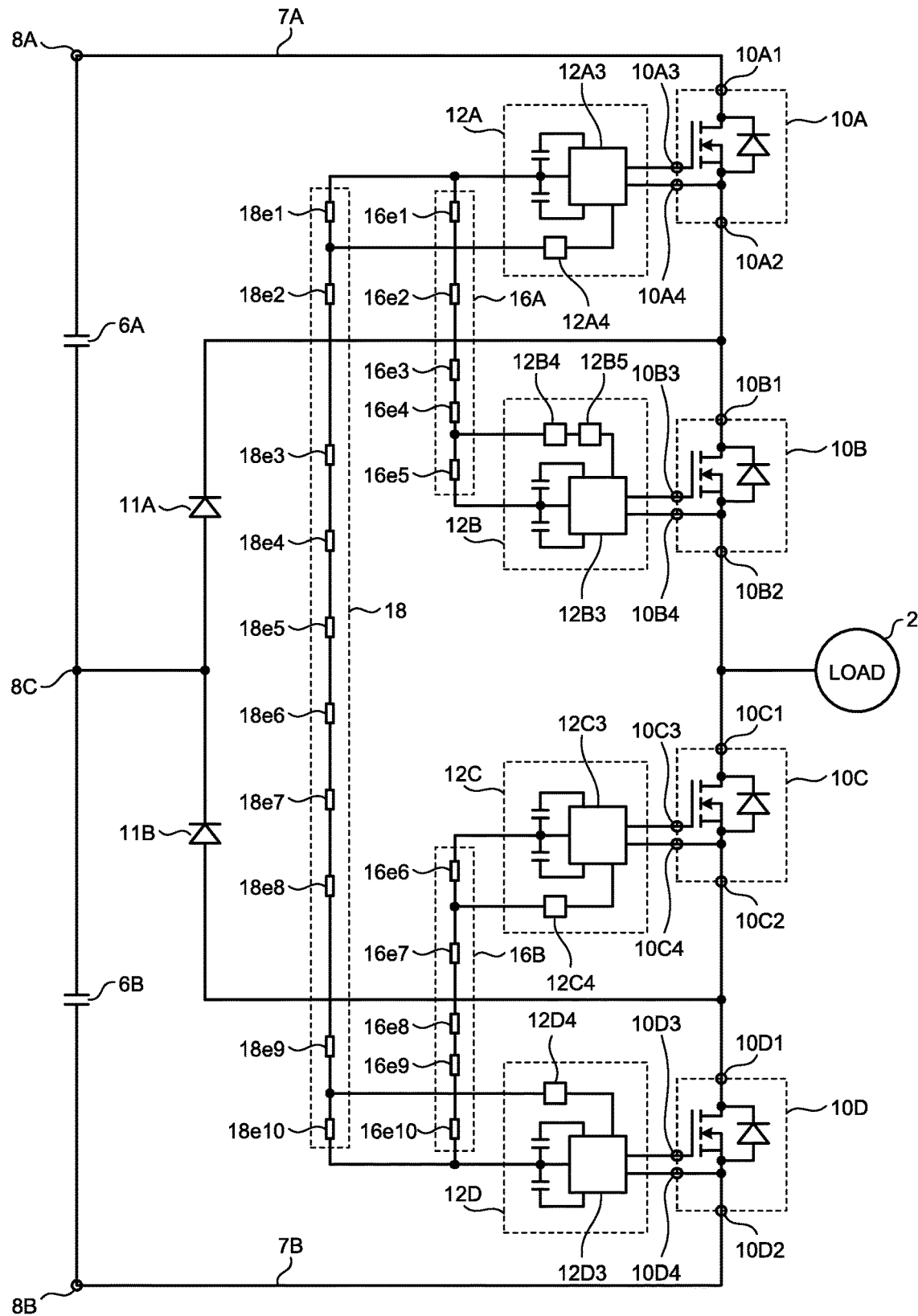
FIG. 12 is a circuit diagram illustrating the configuration of a main part of the power converter according to the third embodiment, the configuration being a combination of those of FIGS. 6, 10, and 11.

As described above, the third embodiment describes the configuration as illustrated in FIGS. 6, 10, and 11 in which a pair of two gate drive circuits is selected from the plurality of gate drive circuits and the two gate drive circuits of the pair are connected by the impedance element group 16 or 18. However, the present invention is not limited to these configurations. A plurality of pairs of two gate drive circuits may be selected from the plurality of gate drive circuits and the two gate drive circuits of each pair may be connected by the impedance element group. For example, the configuration as illustrated in FIG. 12 may be adopted. The configuration illustrated in FIG. 12 is a combination of the configurations in FIGS. 6, 10, and 11, in which an impedance element group 16A including the impedance elements 16e1 to 16e5 is disposed between the gate drive circuits 12A and 12B, an impedance element group 16B including impedance elements 16e6 to 16e10 is disposed between the gate drive circuits 12C and 12D, and the impedance element group 18 including the impedance elements 18e1 to 18e10 is disposed between the gate drive circuits 12A and 12D.

Note that as one can see from the configuration in FIG. 10, for example, the impedance element group 16 can be disposed near the gate drive circuits 12A and 12B. This can shorten a path, namely electrical wiring, through which the voltage information or current information from the impedance element group 16 is transmitted to the gate drive circuits 12A and 12B, thereby preventing noise from being superimposed on the electrical wiring. As a result, an effect is obtained where the gate drive circuits 12A and 12B can change the method of driving the semiconductor switching elements 10A and 10B with high accuracy by using accurate voltage information or accurate current information from the impedance element group 16.

Fourth Embodiment

Figure 13:
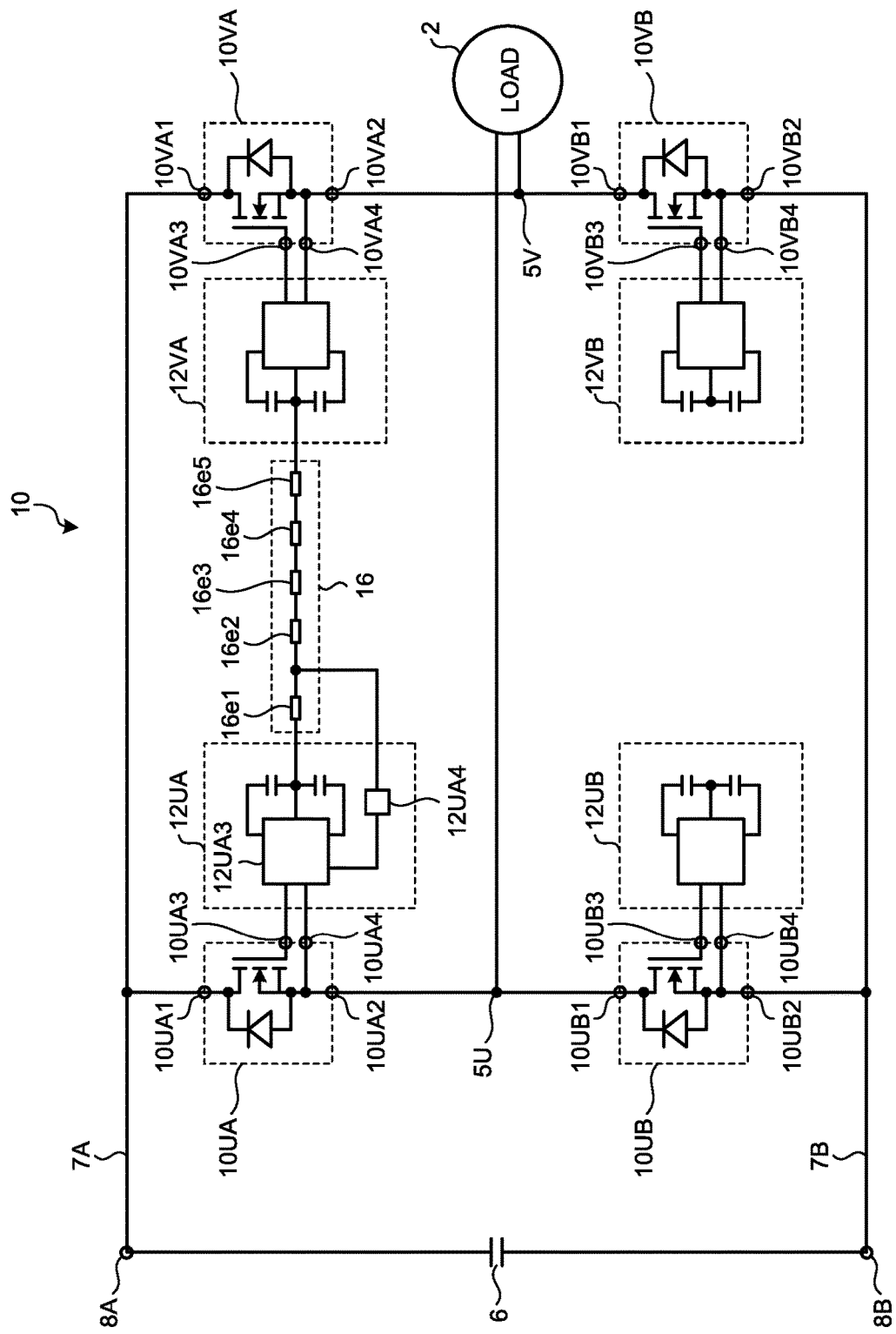
FIG. 13 is a circuit diagram illustrating the configuration of a main part of a power converter according to a fourth embodiment.

FIG. 13 is a circuit diagram illustrating the configuration of a main part of a power converter according to a fourth embodiment. As the configuration of the main part of the power converter according to the fourth embodiment, FIG. 13 illustrates the load 2 to be driven, the power converter main circuit 10 that drives the load 2; gate drive circuits 12UA, 12UB, 12VA, and 12VB that are peripheral circuits that control the power converter main circuit 10; the impedance element group 16 outputting the capacitor voltage information; and the capacitor 6 that is a power supply source for the power converter main circuit 10 and accumulates DC power.

The power converter main circuit 10 of the fourth embodiment is configured to include a semiconductor switching element 10UA as a first U-phase power semiconductor switching element connected to the DC bus 7A on the high potential side; a semiconductor switching element 10UB as a second U-phase power semiconductor switching element connected to the DC bus 7B on the low potential side; a semiconductor switching element 10VA as a first V-phase power semiconductor switching element connected to the DC bus 7A on the high potential side; and a semiconductor switching element 10VB as a second V-phase power semiconductor switching element connected to the DC bus 7B on the low potential side. The semiconductor switching elements 10UA and 10UB are connected in series, and one end of the load 2 is connected to an output terminal 5U that is the electrical connection point of the elements. The semiconductor switching elements 10VA and 10VB are connected in series, and another end of the load 2 is connected to an output terminal 5V that is the electrical connection point of the elements. The power converter main circuit 10 thus forms a single-phase inverter in which the U-phase semiconductor switching elements 10UA and 10UB and the V-phase semiconductor switching elements 10VA and 10VB are bridge-connected.

The semiconductor switching element 10UA is provided with a first main terminal 10UA1, a second main terminal 10UA2, a first signal input terminal 10UA3, and a second signal input terminal 10UA4, while the semiconductor switching element 10UB is provided with a first main terminal 10UB1, a second main terminal 10UB2, a first signal input terminal 10UB3, and a second signal input terminal 10UB4. Similarly, the semiconductor switching element 10VA is provided with a first main terminal 10VA1, a second main terminal 10VA2, a first signal input terminal 10VA3, and a second signal input terminal 10VA4, while the semiconductor switching element 10VB is provided with a first main terminal 10VB1, a second main terminal 10VB2, a first signal input terminal 10VB3, and a second signal input terminal 10VB4.

In the power converter main circuit 10 configured as described above, the first main terminal 10UA1 of the semiconductor switching element 10UA is connected to the DC bus 7A, and the second main terminal 10UB2 of the semiconductor switching element 10UB is connected to the DC bus 7B. Similarly, the first main terminal 10VA1 of the semiconductor switching element 10VA is connected to the DC bus 7A, and the second main terminal 10VB2 of the semiconductor switching element 10VB is connected to the DC bus 7B.

The DC bus 7A is connected to the upper DC terminal 8A of the capacitor 6, and the DC bus 7B is connected to the lower DC terminal 8B of the capacitor 6. That is, the voltage of the capacitor 6 is applied between the DC buses 7A and 7B.

In the power converter main circuit 10 connected as described above, the potential of the DC bus 7A is applied to the load 2 when the semiconductor switching element 10UA or 10VA becomes conductive, and the potential of the DC bus 7B is applied to the load 2 when the semiconductor switching element 10UB or 10VB becomes conductive. The power converter main circuit 10 thus outputs two kinds of potentials, i.e., the potential of the DC bus 7A or the potential of the DC bus 7B, thereby operating as a two-level, single-phase inverter circuit.

Each of the semiconductor switching elements 10UA, 10UB, 10VA, and 10VB is formed of a transistor element and a diode element connected in parallel. Note that connection of the diode element in each of the switching elements may be omitted depending on the characteristic of the load such as when the load is a resistive load.

Although FIG. 13 illustrates a MOSFET as the transistor element, the transistor element is not limited to the MOSFET but may be any device that can switch a state between a low resistance state and a high resistance state by an electrical signal. For example, an IGBT or a bipolar transistor may be used as the transistor element. Moreover, a wide band-gap semiconductor such as SiC, GaN, or diamond in addition to Si which is used widely may be used as a material of the transistor element and the diode element making up each of the semiconductor switching elements 10UA, 10UB, 10VA, and 10VB.

The gate drive circuit 12UA is a first U-phase gate drive circuit that drives the semiconductor switching element 10UA that is the first U-phase power semiconductor switching element, and the gate drive circuit 12UB is a second U-phase gate drive circuit that drives the semiconductor switching element 10UB that is the second U-phase power semiconductor switching element. The gate drive circuit 12VA is a first V-phase gate drive circuit that drives the semiconductor switching element 10VA that is the first V-phase power semiconductor switching element, and the gate drive circuit 12VB is a second V-phase gate drive circuit that drives the semiconductor switching element 10VB that is the second V-phase power semiconductor switching element.

Here, among the gate drive circuits 12UA, 12UB, 12VA, and 12VB illustrated in FIG. 13, the configuration of the gate drive circuit 12UA is identical or equivalent to the configuration of the gate drive circuit 12A according to the first embodiment illustrated in FIG. 1. On the other hand, the configuration of each of the gate drive circuits 12UB, 12VA, and 12VB omits a detector 12UA4 from the configuration of the gate drive circuit 12UA, and is identical or equivalent to the configuration of the gate drive circuit 12B illustrated in FIG. 4. Note that FIG. 13 omits illustration of components corresponding to the insulating circuits 14A and 14B and the switching signal generation unit 20 which are illustrated in FIG. 1.

Note that an operating power supply for operating the detector 12UA4 can also be used as a power supply for driving the gate drive circuit. A dedicated power supply for operating the detector 12UA4 need not be provided if the power supply therefor is also used as the power supply for driving the gate drive circuit.

In the fourth embodiment, the impedance element group 16 is connected between the gate drive circuit 12UA that is the first U-phase gate drive circuit and the gate drive circuit 12VA that is the first V-phase gate drive circuit. That is, FIG. 13 illustrates an example in which the impedance element group 16 is disposed between the gate drive circuits 12UA and 12VA belonging to different phases.

The second main terminal 10UA2 and the second signal input terminal 10UA4 of the semiconductor switching element 10UA have the same potential. Although not illustrated in FIG. 13, the second signal input terminal 10UA4 of the semiconductor switching element 10UA and one end of the impedance element group 16 are connected to the connection point of capacitors connected in series (refer to the capacitors 12A5$a$ and 12A5$b$ in the gate drive circuit 12A in FIG. 1), and thus have the same potential. These also apply to the semiconductor switching element 10VA. Accordingly, the voltage generated in the impedance element group 16 or the current flowing therethrough represents a potential difference between the second main terminal 10UA2 of the semiconductor switching element 10UA and the second main terminal 10VA2 of the semiconductor switching element 10VA. The gate drive circuits 12UA and 12VA can thus know the potential difference between the second main terminal 10UA2 of the semiconductor switching element 10UA and the second main terminal 10VA2 of the semiconductor switching element 10VA by detecting the voltage or the current from the impedance element group 16.

Note that as one can see from the configuration in FIG. 13, the impedance element group 16 can be disposed near the gate drive circuits 12UA and 12VA. This can shorten a path, namely electrical wiring, through which voltage information or current information from the impedance element group 16 is transmitted to the gate drive circuits 12UA and 12VA, thereby preventing noise from being superimposed on the electrical wiring. As a result, an effect is obtained where the gate drive circuits 12UA and 12VA can change the method of driving the semiconductor switching element 10UA or 10VA with high accuracy by using accurate voltage information or accurate current information from the impedance element group 16.

Next, the operation of the power converter according to the fourth embodiment will be described with reference to FIGS. 13 to 17 as appropriate. Note that the operation of the gate drive circuit will be described with reference to the gate drive circuit 12UA including a switching speed changing unit 12UA3 and the detector 12UA4. The description assumes that the voltage stored in the capacitor 6 is 1000 [V], and the negative terminal of the capacitor 6 is set as the reference potential. That is, the potential at the negative terminal of the capacitor 6 is 0 [V].

Figure 14:
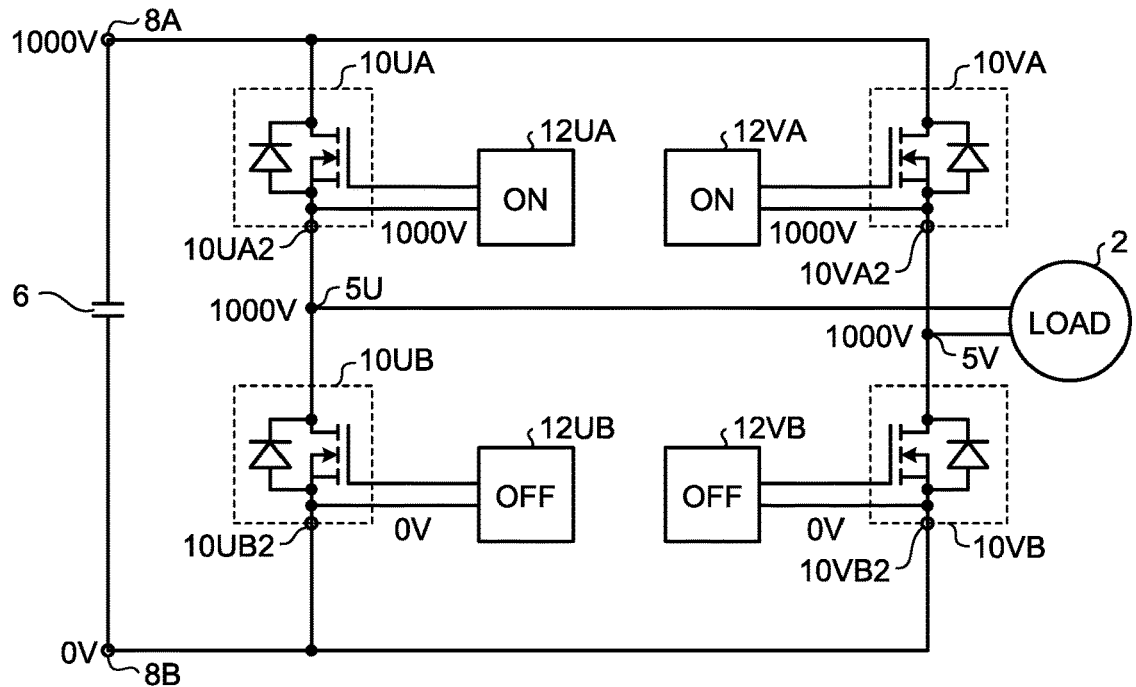
FIG. 14 is a circuit diagram illustrating one mode of the operation of the power converter according to the fourth embodiment.

FIG. 14 is a circuit diagram illustrating one mode of the operation of the power converter according to the fourth embodiment. FIG. 14 illustrates the mode in which the semiconductor switching elements 10UA and 10VA are on, the semiconductor switching elements 10UB and 10VB are off, the potential of the output terminal 5U to which the one end of the load 2 is connected matches the potential of the upper DC terminal 8A, and the potential of the output terminal 5V to which the other end of the load 2 is connected also matches the potential of the upper DC terminal 8A. Thus, the potential at the second main terminal 10UA2 of the semiconductor switching element 10UA is +1000 [V], and the potential at the second main terminal 10VA2 of the semiconductor switching element 10VA is also +1000 [V]. The potential at the second main terminal 10UB2 of the semiconductor switching element 10UB is 0 [V], and the potential at the second main terminal 10VB2 of the semiconductor switching element 10VB is also 0 [V].

Figure 15:
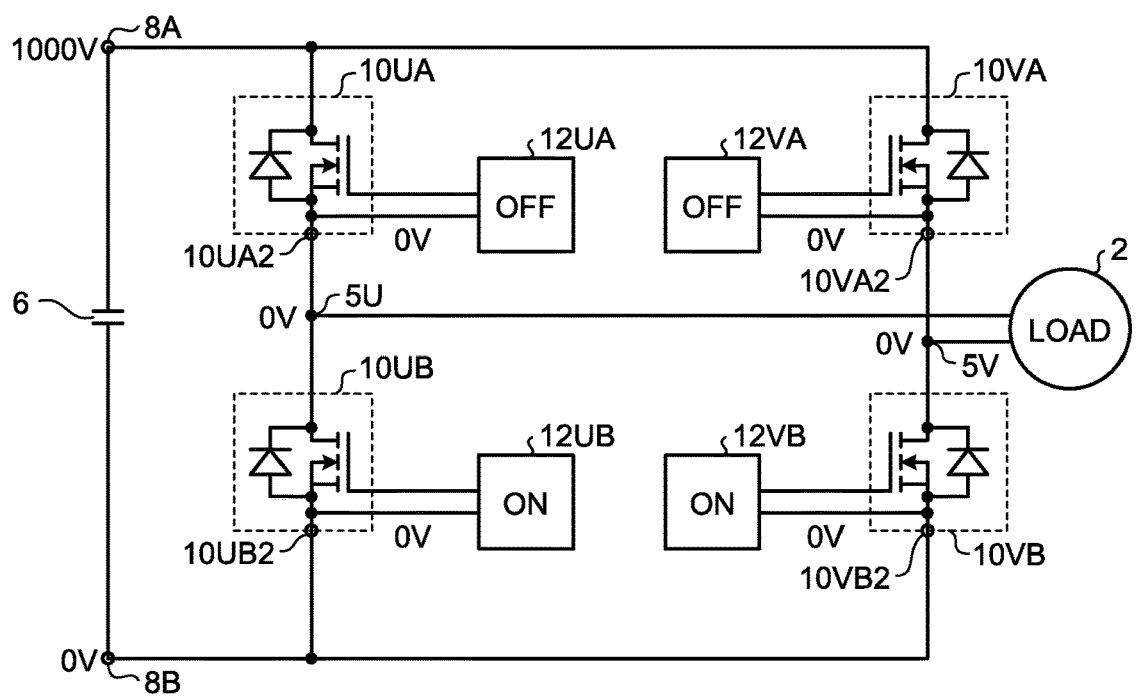
FIG. 15 is a circuit diagram illustrating a mode of the operation of the power converter according to the fourth embodiment, the mode being different from that of FIG. 14.

FIG. 15 is a circuit diagram illustrating one mode of the operation of the power converter according to the fourth embodiment, the mode being different from that of FIG. 14. FIG. 15 illustrates the mode in which the semiconductor switching elements 10UA and 10VA are off, the semiconductor switching elements 10UB and 10VB are on, the potential of the output terminal 5U matches the potential of the lower DC terminal 8B, and the potential of the output terminal 5V also matches the potential of the lower DC terminal 8B. Thus, the potential at the second main terminal 10UA2 of the semiconductor switching element 10UA is 0 [V], and the potential at the second main terminal 10VA2 of the semiconductor switching element 10VA is also 0 [V]. The potential at the second main terminal 10UB2 of the semiconductor switching element 10UB is 0 [V], and the potential at the second main terminal 10VB2 of the semiconductor switching element 10VB is also 0 [V].

Figure 16:
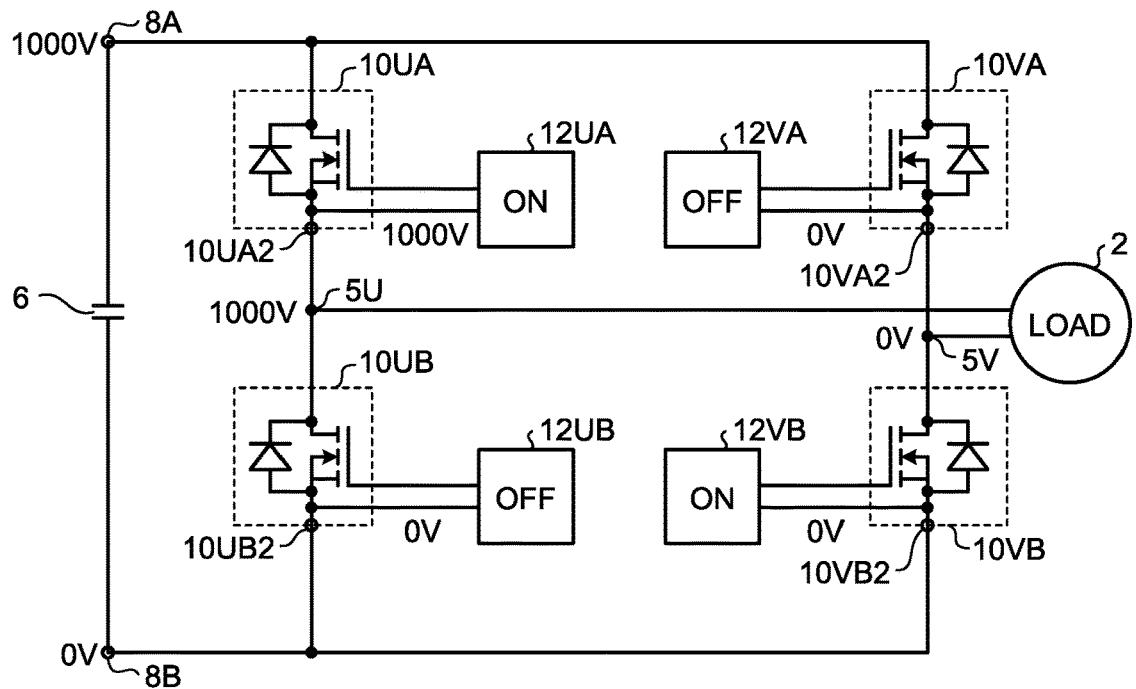
FIG. 16 is a circuit diagram illustrating a mode of the operation of the power converter according to the fourth embodiment, the mode being different from that of each of FIGS. 14 and 15.

FIG. 16 is a circuit diagram illustrating one mode of the operation of the power converter according to the fourth embodiment, the mode being different from that of each of FIGS. 14 and 15. FIG. 16 illustrates the mode in which the semiconductor switching elements 10UA and 10VB are on, the semiconductor switching elements 10UB and 10VA are off, the potential of the output terminal 5U matches the potential of the upper DC terminal 8A, and the potential of the output terminal 5V matches the potential of the lower DC terminal 8B. Thus, the potential at the second main terminal 10UA2 of the semiconductor switching element 10UA is +1000 [V], and the potential at the second main terminal 10VA2 of the semiconductor switching element 10VA is 0 [V]. The potential at the second main terminal 10UB2 of the semiconductor switching element 10UB is 0 [V], and the potential at the second main terminal 10VB2 of the semiconductor switching element 10VB is also 0 [V].

Figure 17:
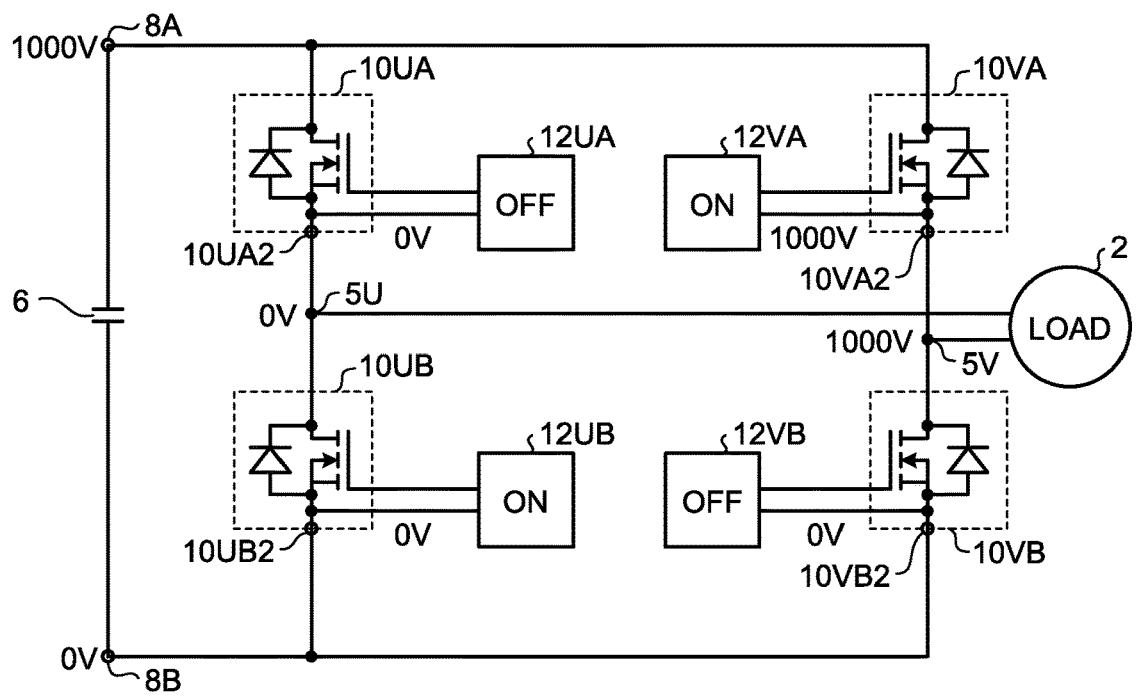
FIG. 17 is a circuit diagram illustrating a mode of the operation of the power converter according to the fourth embodiment, the mode being different from that of each of FIGS. 14 to 16.

FIG. 17 is a circuit diagram illustrating one mode of the operation of the power converter according to the fourth embodiment, the mode being different from that of each of FIGS. 14 to 16. FIG. 17 illustrates the mode in which the semiconductor switching elements 10UA and 10VB are off, the semiconductor switching elements 10UB and 10VA are on, the potential of the output terminal 5U matches the potential of the lower DC terminal 8B, and the potential of the output terminal 5V matches the potential of the upper DC terminal 8A. Thus, the potential at the second main terminal 10UA2 of the semiconductor switching element 10UA is 0 [V], and the potential at the second main terminal 10VA2 of the semiconductor switching element 10VA is +1000 [V]. The potential at the second main terminal 10UB2 of the semiconductor switching element 10UB is 0 [V], and the potential at the second main terminal 10VB2 of the semiconductor switching element 10VB is also 0 [V].

In the state illustrated in each of FIGS. 16 and 17, a voltage of 1000 [V] identical to the capacitor voltage is applied to the impedance element group 16. The detector 12UA4 included in the gate drive circuit 12UA determines the magnitude relationship between the voltage across the impedance element group 16 representing the capacitor voltage information and the reference voltage, and transmits the result of the determination to the switching speed changing unit 12UA3. The switching speed changing unit 12UA3 can determine whether the capacitor voltage is lower or higher than the reference voltage on the basis of the result of the determination.

When determining that the capacitor voltage is lower than the reference voltage, the switching speed changing unit 12UA3 switches control to one that increases the driving speed of the semiconductor switching element 10UA. This control prevents a switching loss of the semiconductor switching element 10UA. Note that although the above control increases the surge voltage generated at the time of switching, the capacitor voltage is low, so that no excessive voltage is applied to the components inside the power converter main circuit 10. The transition is thus made between the state of FIG. 16 and the state of FIG. 15, and between the state of FIG. 17 and the state of FIG. 14.

On the other hand, when determining that the capacitor voltage is higher than the reference voltage, the switching speed changing unit 12UA3 switches control to one that reduces the driving speed of the semiconductor switching element 10UA. Although the capacitor voltage is high, this control reduces the surge voltage generated at the time of switching to be able to prevent application of an excessive voltage to the components inside the power converter main circuit 10.

Note that a storage may be provided in the gate drive circuit as with the second embodiment illustrated in FIG. 5.

Figure 18:
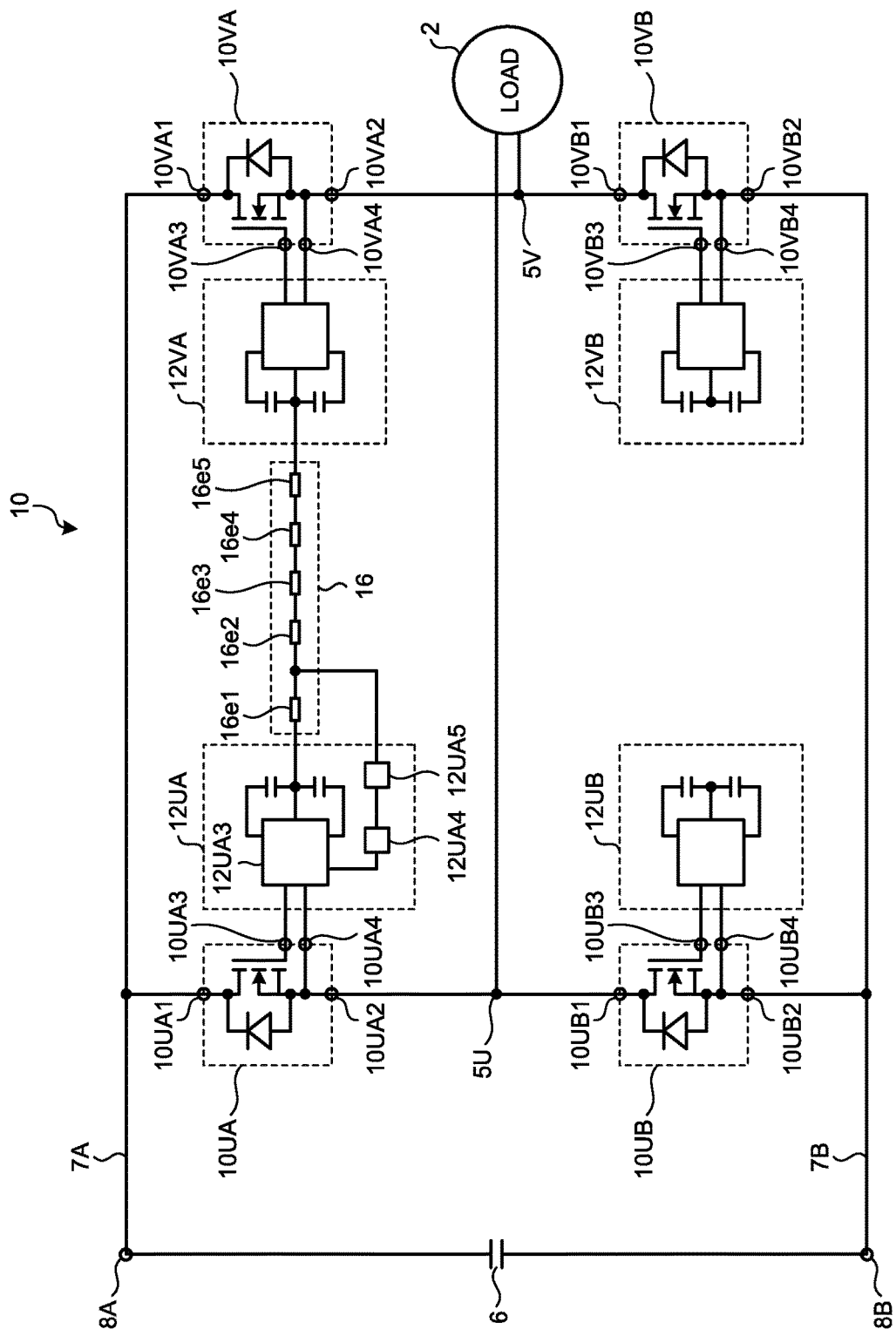
FIG. 18 is a circuit diagram illustrating the configuration of a main part of the power converter according to the fourth embodiment, the configuration being different from that of FIG. 13.

FIG. 18 is a circuit diagram illustrating the configuration of a main part of the power converter according to the fourth embodiment, the configuration being different from that of FIG. 13 and including a storage 12UA5 in the gate drive circuit 12UA.

In the state illustrated in each of FIGS. 16 and 17, a voltage of 1000 [V] identical to the capacitor voltage is applied to the impedance element group 16. The detector 12UA4 determines the magnitude relationship between the voltage from the impedance element group 16 and the reference voltage. When the detector 12UA4 determines that the voltage from the impedance element group 16 is lower than the reference voltage, the result of the determination is stored in the storage 12UA5.

The switching speed changing unit 12UA3 switches control to one that increases the driving speed of the semiconductor switching element 10UA on the basis of the information determined to be lower than the reference voltage and stored in the storage 12UA5. This control prevents a switching loss of the semiconductor switching element 10UA. Note that although the above control increases the surge voltage generated at the time of switching, the capacitor voltage is low, so that no excessive voltage is applied to the components inside the power converter main circuit 10. The transition is thus made between the state of FIG. 16 and the state of FIG. 15, and between the state of FIG. 17 and the state of FIG. 14.

On the other hand, when the detector 12UA4 determines that the voltage from the impedance element group 16 is higher than the reference voltage, the result of the determination is stored in the storage 12UA5. Information stored in the storage 12UA5 is overwritten with a new result of the determination. That is, the latest result of the determination is stored in the storage 12UA5.

The switching speed changing unit 12UA3 switches control to one that reduces the driving speed of the semiconductor switching element 10UA on the basis of the information determined to be higher than the reference voltage and stored in the storage 12UA5. Although the capacitor voltage is high, this control reduces the surge voltage generated at the time of switching to be able to prevent application of an excessive voltage to the components inside the power converter main circuit 10.

Note that although FIG. 13 illustrates the configuration in which the detector 12UA4 is provided only in the gate drive circuit 12UA that is the first U-phase gate drive circuit, the detector may also be provided in the gate drive circuit 12VA that is the first V-phase gate drive circuit. This configuration allows the gate drive circuit 12VA to change the method of driving the semiconductor switching element 10VA that is the first V-phase power semiconductor switching element on the basis of output of the detector. Note that in this configuration as well, a storage may be provided in the gate drive circuit 12VA as in FIG. 18, whereby the effect similar to that of the second and third embodiments can be obtained.

Figure 19:
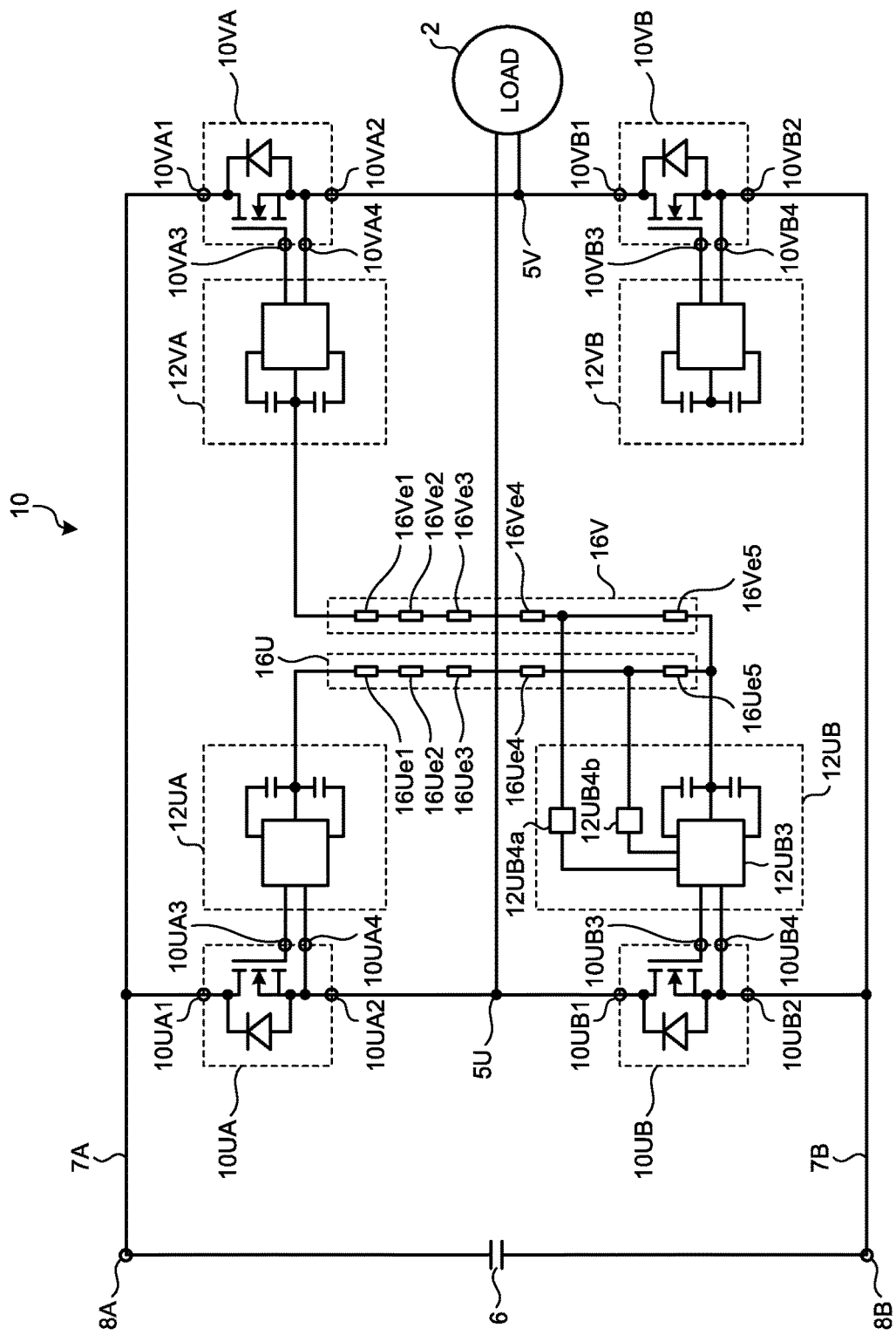
FIG. 19 is a circuit diagram illustrating the configuration of a main part of the power converter according to the fourth embodiment, the configuration being different from that of each of FIGS. 13 and 18.

FIG. 19 is a circuit diagram illustrating the configuration of a main part of the power converter according to the fourth embodiment, the configuration being different from that of each of FIGS. 13 and 18. The characteristic of the configuration illustrated in FIG. 19 is that two impedance element groups 16U and 16V are included as impedance element groups, the first impedance element group 16U is connected between the gate drive circuit 12UA that is the first U-phase gate drive circuit and the gate drive circuit 12UB that is the second U-phase gate drive circuit, the second impedance element group 16V is connected between the gate drive circuit 12VA that is the first V-phase gate drive circuit and the gate drive circuit 12UB that is the second U-phase gate drive circuit, and the gate drive circuit 12UB is provided with a second detector 12UB4b that detects a voltage or current across the first impedance element group 16U and a first detector 12UB4a that detects a voltage or current across the second impedance element group 16V.

The first detector 12UB4a provided in the gate drive circuit 12UB can transmit, to a switching speed changing unit 12UB3, capacitor voltage information that is obtained from voltage information or current information output from the first impedance element group 16U. The second detector 12UB4b provided in the gate drive circuit 12UB can transmit, to the switching speed changing unit 12UB3, capacitor voltage information that is obtained from voltage information or current information output from the second impedance element group 16V.

On the basis of the capacitor voltage information, the switching speed changing unit 12UB3 can perform control to switch or change the driving speed of the semiconductor switching element 10UB. Note that the control for switching the driving speed is as described above, and thus will not be described in detail.

According to the configuration of the power converter illustrated in FIG. 19, the opportunity to obtain the capacitor voltage information increases in the switching cycle in which the semiconductor switching elements 10UA, 10UB, 10VA, and 10VB making up the power converter main circuit 10 are turned on or off, whereby an effect is obtained where the method of driving the semiconductor switching element 10UB can be changed with higher accuracy than the configurations described in the first to third embodiments.

The configurations illustrated in the aforementioned embodiments merely illustrate examples of the content of the preset invention, and can thus be combined with another known technique or partially omitted and/or modified without departing from the scope of the present invention.

REFERENCE SIGNS LIST 2 load; 5U, 5V output terminal; 6, 6A, 6B capacitor; 7A, 7B DC bus; 8A upper DC terminal; 8B lower DC terminal; 8C intermediate DC terminal; 10 power converter main circuit; 10A1, 10B1, 10C1, 10D1, 10UA1, 10UB1, 10VA1, 10VB1 first main terminal; 10A2, 10B2, 10C2, 10D2, 10UA2, 10UB2, 10VA2, 10VB2 second main terminal; 10A3, 10B3, 10C3, 10D3, 10UA3, 10UB3, 10VA3, 10VB3 first signal input terminal; 10A4, 10B4, 10C4, 10D4, 10UA4, 10UB4, 10VA4, 10VB4 second signal input terminal; 10A, 10B, 10C, 10D, 10UA, 10UB, 10VA, 10VB semiconductor switching element; 11A, 11B clamping diode; 12A1$a$ first on transistor; 12A1$b$ first off transistor; 12A1$c$ second on transistor; 12A1$d$ second off transistor; 12A, 12B, 12C, 12D, 12UA, 12UB, 12VA, 12VB gate drive circuit; 12A2$a$, 12A2$b$, 12A2$c$, 12A2$d$ gate resistor; 12A5$a$, 12A5$b$, 12B5$a$, 12B5$b$ capacitor; 12A4$a$ comparator; 12A3, 12B3, 12C3, 12D3, 12UA3, 12UB3 switching speed changing unit; 12A5, 12B5, 12UA5 storage; 12A4, 12B4, 12C4, 12D4, 12UA4, 12UB4$a$, 12UB4$b$ detector; 12A4$b$, 12A4$c$ resistance element; 14A, 14B insulating circuit; 14A1 light-emitting diode; 14A2 phototransistor; 16, 16A, 16B, 16U, 16V, 18 impedance element group; 16$e$1 to 16$e$10, 18$e$1 to 18$e$10 impedance element; 20 switching signal generation unit.

The invention claimed is:
1. A power converter comprising:
  a power converter main circuit including two or more semiconductor switching elements;

gate drive circuits, each of which drives a corresponding one of the semiconductor switching elements; and one or a plurality of impedance elements electrically connected between at least one pair of the gate drive circuits, wherein at least one of the gate drive circuits includes a detector to detect a voltage across the impedance elements or a current flowing through the impedance elements, and changes a driving speed of the semiconductor switching elements in accordance with an output of the detector.

2. The power converter according to claim 1, wherein the power converter main circuit includes a multi-level circuit corresponding to one phase or a plurality of phases to select a potential of any one of two or more DC terminals and output the selected potential to a load, the multi-level circuit includes two or more semiconductor switching elements connected in series, and the impedance elements are disposed between the gate drive circuits belonging to a same phase.

3. The power converter according to claim 2, wherein the multi-level circuit is a two-level circuit to select a potential of either one of an upper DC terminal and a lower DC terminal and output the selected potential to the load, the two-level circuit includes a first semiconductor switching element and a second semiconductor switching element sequentially connected in series between the upper DC terminal and the lower DC terminal, and a connection point of the first semiconductor switching element and the second semiconductor switching element is connected to the load.

4. The power converter according to claim 2, wherein the multi-level circuit is a three-level circuit to select a potential of any one of an upper DC terminal, an intermediate DC terminal, and a lower DC terminal and output the selected potential to the load, the three-level circuit includes:

first, second, third, and fourth semiconductor switching elements sequentially connected in series between the upper DC terminal and the lower DC terminal;

a first diode element connected between the intermediate DC terminal and a connection point of the first semiconductor switching element and the second semiconductor switching element; and a second diode element connected between the intermediate DC terminal and a connection point of the third semiconductor switching element and the fourth semiconductor switching element, and a connection point of the second semiconductor switching element and the third semiconductor switching element is connected to the load.

5. The power converter according to claim 1, wherein the power converter main circuit includes a multi-level circuit corresponding to a plurality of phases to select a potential of any one of two or more DC terminals and output the selected potential to a load, the multi-level circuit includes two or more semiconductor switching elements connected in series for each phase, and the impedance elements are disposed between the gate drive circuits belonging to different phases.

6. The power converter according to claim 5, wherein the multi-level circuit is a two-level circuit to select a potential of either one of an upper DC terminal and a lower DC terminal and output the selected potential to the load, the two-level circuit includes a first semiconductor switching element and a second semiconductor switching element sequentially connected in series between the upper DC terminal and the lower DC terminal, and a connection point of the first semiconductor switching element and the second semiconductor switching element is connected to the load.

7. The power converter according to claim 5, wherein the multi-level circuit is a three-level circuit to select a potential of any one of an upper DC terminal, an intermediate DC terminal, and a lower DC terminal and output the selected potential to the load, the three-level circuit includes:

first, second, third, and fourth semiconductor switching elements sequentially connected in series between the upper DC terminal and the lower DC terminal;

a first diode element connected between the intermediate DC terminal and a connection point of the first semiconductor switching element and the second semiconductor switching element; and a second diode element connected between the intermediate DC terminal and a connection point of the third semiconductor switching element and the fourth semiconductor switching element, and a connection point of the second semiconductor switching element and the third semiconductor switching element is connected to the load.

8. The power converter according to claim 1, wherein the gate drive circuit increases the driving speed of the semiconductor switching element when a voltage transmitted from the impedance element to the gate drive circuit is lower than a reference voltage.

9. The power converter according to claim 1, wherein the gate drive circuit reduces the driving speed of the semiconductor switching element when a voltage transmitted from the impedance element to the gate drive circuit is higher than a reference voltage.

10. The power converter according to claim 1, wherein at least one of the gate drive circuits includes a storage to store information on whether a voltage transmitted from the impedance elements is higher or lower than a reference voltage, and the gate drive circuit that includes the storage changes the driving speed of the semiconductor switching element on a basis of the information stored in the storage.

* * * * *